United States Patent
Tsuda

(10) Patent No.: US 8,575,980 B2
(45) Date of Patent: Nov. 5, 2013

(54) PLL CIRCUIT, ERROR CORRECTING METHOD FOR THE SAME, AND COMMUNICATION APPARATUS INCLUDING THE SAME

(75) Inventor: Shinichiro Tsuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 97 days.

(21) Appl. No.: 13/282,841

(22) Filed: Oct. 27, 2011

(65) Prior Publication Data

US 2012/0133401 A1    May 31, 2012

(30) Foreign Application Priority Data

Nov. 25, 2010  (JP) ................ P2010-262781

(51) Int. Cl.
*H03L 7/06*  (2006.01)

(52) U.S. Cl.
USPC ......................................... 327/156; 327/147

(58) Field of Classification Search
USPC ................................................. 327/147, 156
See application file for complete search history.

(56) References Cited

U.S. PATENT DOCUMENTS

| | | | |
|---|---|---|---|
| 8,390,349 B1* | 3/2013 | Ravi et al. | 327/156 |
| 2010/0277211 A1* | 11/2010 | Geng et al. | 327/158 |
| 2011/0009083 A1* | 1/2011 | Namba et al. | 455/318 |
| 2011/0234270 A1* | 9/2011 | Kobayashi | 327/156 |
| 2011/0298506 A1* | 12/2011 | Salle et al. | 327/156 |
| 2012/0100821 A1* | 4/2012 | Dan et al. | 455/269 |
| 2012/0119800 A1* | 5/2012 | Yamasaki et al. | 327/142 |
| 2012/0133401 A1* | 5/2012 | Tsuda | 327/147 |
| 2012/0161831 A1* | 6/2012 | Ravi et al. | 327/156 |
| 2012/0161832 A1* | 6/2012 | Lee et al. | 327/156 |
| 2012/0161834 A1* | 6/2012 | Lee et al. | 327/156 |
| 2012/0242383 A1* | 9/2012 | Elad et al. | 327/156 |
| 2013/0002317 A1* | 1/2013 | Frantzeskakis et al. | 327/156 |

* cited by examiner

*Primary Examiner* — Adam Houston
(74) *Attorney, Agent, or Firm* — Sherr & Jiang, PLLC

(57) ABSTRACT

A PLL circuit includes: the number-of-accumulated clocks detecting portion detecting the number of accumulated clocks of an oscillation circuit as a digital value; a periodicity detecting portion detecting periodicity of a digital value of a fractional portion of the number of accumulated clocks of the oscillation circuit with a first reference clock as a reference; a corrected value calculating portion calculating a corrected value; and an adding portion adding the corrected value to the fractional portion of the number of accumulated clocks with the first reference clock from the starting points of the periods of the periodicity.

17 Claims, 18 Drawing Sheets

FIG. 1

| ARITHMETIC OPERATION PERIOD | FRACTIONAL PORTION OF THE NUMBER OF ACCUMULATED CLOCKS | TDC CIRCUIT OUTPUT | PHASE COMPARATOR OUTPUT | CORRECTED VALUE x ADDED TO TDC OUTPUT |
|---|---|---|---|---|
| M | $\frac{2 \cdot \Delta t}{T}$ | $\frac{2 \cdot \Delta t}{T}$ | $\frac{\Delta t}{T} \cdot \frac{a+M}{M} - \left(\frac{2 \cdot \Delta t}{T} + x\right) = 0$ | $\frac{\Delta t}{T} \cdot \left(\frac{a}{M} - 1\right)$ |
| M+1 | $\frac{\Delta t}{T} \cdot \left(2 + \frac{1}{M}\right)$ | $\frac{2 \cdot \Delta t}{T}$ | $\frac{\Delta t}{T} \cdot \frac{a+M+1}{M} - \left(\frac{\Delta t}{T} \cdot 2 + x\right) = 0$ | $\frac{\Delta t}{T} \cdot \left(\frac{a+1}{M} - 1\right)$ |
| M+2 | $\frac{\Delta t}{T} \cdot \left(2 + \frac{2}{M}\right)$ | $\frac{2 \cdot \Delta t}{T}$ | $\frac{\Delta t}{T} \cdot \frac{a+M+2}{M} - \left(\frac{\Delta t}{T} \cdot 2 + x\right) = 0$ | $\frac{\Delta t}{T} \cdot \left(\frac{a+2}{M} - 1\right)$ |
| ... | ... | ... | ... | ... |
| M+k | $\frac{\Delta t}{T} \cdot \left(2 + \frac{k}{M}\right)$ | $\frac{2 \cdot \Delta t}{T}$ | $\frac{\Delta t}{T} \cdot \frac{a+M+k}{M} - \left(\frac{\Delta t}{T} \cdot 2 + x\right) = 0$ | $\frac{\Delta t}{T} \cdot \left(\frac{a+k}{M} - 1\right)$ |
| ... | ... | ... | ... | ... |
| 2M | $\frac{3 \cdot \Delta t}{T}$ | $\frac{3 \cdot \Delta t}{T}$ | $\frac{\Delta t}{T} \cdot \frac{a+2M}{M} - \left(\frac{3 \cdot \Delta t}{T} + x\right) = 0$ | $\frac{\Delta t}{T} \cdot \left(\frac{a}{M} - 1\right)$ |

FIG. 8

| ARITHMETIC OPERATION PERIOD | x | ... | x+k−1 | x+k | x+k+1 | x+k+2 | ... | x+l−1 | x+l | x+l+1 | ... | x+m−1 | x+m |
|---|---|---|---|---|---|---|---|---|---|---|---|---|---|
| $D_R$ | 12 | ... | 12 | 1 | 1 | 1 | ... | 2 | 3 | 3 | ... | 8 | 9 |
| $D_F$ | 6 | ... | 6 | 7 | 7 | 7 | ... | 8 | 9 | 9 | ... | 2 | 3 |
| SELECTED OUTPUT | $D_F$ | ... | $D_F$ | $D_F$ | $D_F$ | $D_F$ | ... | $D_F$ | $D_R$ | $D_R$ | ... | $D_R$ | $D_F$ |

| ARITHMETIC OPERATION PERIOD | FRACTIONAL PORTION OF ACCUMULATIVE ADDER 2 | FRACTIONAL PORTION OF ACCUMULATIVE ADDER 2 ADDER OUTPUT | VARIABLE GAIN CIRCUIT OUTPUT | ERROR OF OSCILLATION FREQUENCY |
|---|---|---|---|---|
| | | MINIMUM RESOLUTION OF TDC $\frac{\Delta t}{T}$ | | |
| | | FRACTIONAL PORTION OF SET FREQUENCY DIVIDING RATIO $\frac{\Delta t}{T} \cdot \frac{1}{M}$ ($M \geq 2$) | | |
| | | INITIAL VALUE OF ACCUMULATIVE ADDER 1 $\frac{\Delta t}{T} \cdot \frac{a}{M}$ (a: INTEGRAL NUMBER) | | |
| | | INITIAL VALUE OF FRACTIONAL PORTION OF ACCUMULATIVE ADDER 2 $\frac{\Delta t}{T}$ | | |
| 0 | $\frac{\Delta t}{T}$ | $\frac{\Delta t}{T} \cdot \left(\frac{a}{M} - 1\right)$ | $-\frac{1}{2^a} \cdot \frac{\Delta t}{T} \cdot \left(1 - \frac{a}{M}\right)$ | $-\frac{1}{2^a} \cdot \frac{\Delta t}{T} \cdot \left(1 - \frac{a}{M}\right) \cdot f_{REF}$ |
| 1 | $\frac{\Delta t}{T} \left\{1 + \frac{1}{M} - \frac{1}{2^a} \left(1 - \frac{a}{M}\right)\right\}$ | $\frac{\Delta t}{T} \cdot \left(\frac{a+1}{M} - 1\right)$ | $-\frac{1}{2^a} \cdot \frac{\Delta t}{T} \cdot \left(1 - \frac{a+1}{M}\right)$ | $-\frac{1}{2^a} \cdot \frac{\Delta t}{T} \cdot \left(1 - \frac{a+1}{M}\right) \cdot f_{REF}$ |
| 2 | $\frac{\Delta t}{T} \left\{1 + \frac{2}{M} - \frac{1}{2^a} \left(2 - \frac{a}{M} - \frac{a+1}{M}\right)\right\}$ | $\frac{\Delta t}{T} \cdot \left(\frac{a+2}{M} - 1\right)$ | $-\frac{1}{2^a} \cdot \frac{\Delta t}{T} \cdot \left(1 - \frac{a+2}{M}\right)$ | $-\frac{1}{2^a} \cdot \frac{\Delta t}{T} \cdot \left(1 - \frac{a+2}{M}\right) \cdot f_{REF}$ |
| ... | ... | ... | ... | ... |
| M | $\frac{\Delta t}{T} \left\{2 - \frac{1}{2^a} \left(M - \frac{M+2a-1}{2}\right)\right\}$ $= \frac{2 \cdot \Delta t}{T}$ $\downarrow$ $M - \frac{M+2a-1}{2} = 0$ $\therefore a = \frac{M+1}{2}$ | $\frac{\Delta t}{T} \cdot \left(\frac{a}{M} - 1\right)$ | $-\frac{1}{2^a} \cdot \frac{\Delta t}{T} \cdot \left(1 - \frac{a}{M}\right)$ | $-\frac{1}{2^a} \cdot \frac{\Delta t}{T} \cdot \left(1 - \frac{a}{M}\right) \cdot f_{REF}$ |

FIG. 16

PLL CIRCUIT, ERROR CORRECTING METHOD FOR THE SAME, AND COMMUNICATION APPARATUS INCLUDING THE SAME

BACKGROUND

The present disclosure relates to a PLL circuit, an error correcting method for the same, and a communication apparatus including the same.

For the purpose of locking a carrier frequency to a precise frequency, a Phase Locked Loop (PLL) circuit is used in a wireless communication terminal. In recent years, along with the scale down of the semiconductor process, attention is being focused on a configuration in which a Voltage Controlled Oscillator (VCO) adapted to be controlled with an analog voltage is replaced with a Digital Controlled Oscillator (DCO).

In the existing PLL circuit using the VCO, a phase comparator compares a phase difference between a reference clock and clock obtained by frequency-dividing a VCO output signal with each other. Here, a circuit for converting a phase difference into a pulse width taking three states: up; down; and up+down is used as the general phase comparator. Also, a current source of a charge pump circuit is controlled by using this pulse, and a current outputted is converted into a voltage by a loop filter, thereby controlling the VCO.

On the other hand, FIG. 11 shows an example of an All-Digital PLL circuit using the DCO on which attention has been focused recently. In the All-Digital PLL circuit using the DCO, a Fractional component of the number of accumulated clocks corresponding to a phase difference is converted into a digital value by a Time-to-Digital Converter (TDC) circuit, and an Integer component thereof is converted into a digital value by an accumulator circuit. Also, a digital value corresponding to a phase difference between these digital values thus detected is fed back by utilizing any of various methods, thereby digitally controlling the DCO. Such a technique, for example, is disclosed in a related-art document of R. B. Staszewski et al. "All-Digital Phase-Domain TX Frequency Synthesizer for Bluetooth Radios in 0.13 µm CMOS, ISSCC2004 Digest.

SUMMARY

However, when a frequency dividing ratio having a small fractional portion is set in the PLL circuit using the TDC circuit, there is feared generation of a periodic error due to a resolution of the TDC circuit. Also, there is caused a problem that the periodic error due to the resolution of the TDC circuit generates a spurious component.

The present disclosure has been made in order to solve the problems described above, and it is therefore desirable to provide novel and improved PLL circuit, error correcting method for the same, and communication apparatus including the same which are capable of correcting for a periodic error generated due to a finite resolution of a TDC circuit used in the PLL circuit having a digital controlled oscillator.

In order to attain the desire described above, according to an embodiment of the present disclosure, there is provided a PLL circuit including: a number-of-accumulated clocks detecting portion detecting the number of accumulated clocks of an oscillation circuit as a digital value; a periodicity detecting portion detecting periodicity of a digital value of a fractional portion of the number of accumulated clocks of the oscillation circuit with a first reference clock as a reference; a corrected value calculating portion calculating a corrected value from a digital value of one period of an output clock of the oscillation circuit, a digital value of one period of periodicity which the fractional portion of the number of accumulated clocks of the oscillator circuit has, and a value obtained by counting the number of first reference clocks from starting points of periods of the periodicity which the fractional portion of the number of accumulated clocks of the oscillator circuit has; and an adding portion adding the corrected value to the fractional portion of the number of accumulated clocks with the first reference clock from the starting points of the periods of the periodicity.

According to another embodiment of the present disclosure, there is provided an error correcting method for a PLL circuit including: detecting the number of accumulated clocks of an oscillation circuit as a digital value; detecting periodicity of a digital value of a fractional portion of the number of accumulated clocks of the oscillation circuit with a first reference clock as a reference; calculating a corrected value from a digital value of one period of an output clock of the oscillation circuit, a digital value of one period of periodicity which the fractional portion of the number of accumulated clocks of the oscillator circuit has, and a value obtained by counting the number of first reference clocks from starting points of periods of the periodicity which the fractional portion of the number of accumulated clocks of the oscillator circuit has; and adding the corrected value to the fractional portion of the number of accumulated clocks with the first reference clock from the starting points of the periods of the periodicity.

According to still another embodiment of the present disclosure, there is provided a communication apparatus including: a PLL circuit including a number-of-accumulated clocks detecting portion detecting the number of accumulated clocks of an oscillation circuit as a digital value, a periodicity detecting portion detecting periodicity of a digital value of a fractional portion of the number of accumulated clocks of the oscillation circuit with a first reference clock as a reference, a corrected value calculating portion calculating a corrected value from a digital value of one period of an output clock of the oscillation circuit, a digital value of one period of periodicity which the fractional portion of the number of accumulated clocks of the oscillator circuit has, and a value obtained by counting the number of first reference clocks from starting points of periods of the periodicity which the fractional portion of the number of accumulated clocks of the oscillator circuit has, and an adding portion adding the corrected value to the fractional portion of the number of accumulated clocks with the first reference clock from the starting points of the periods of the periodicity.

As set forth hereinabove, according to the embodiments of the present disclosure, it is possible to provide the novel and improved PLL circuit, error correcting method for the same, and communication apparatus including the same which are capable of correcting for the periodic error generated due to the finite resolution of the TDC circuit used in the PLL circuit having the digital controlled oscillator.

BRIEF DESCRIPTION OF THE DRAWINGS

FIG. 1 is an explanatory view showing calculation of a corrected value when a periodic error generated due to an finite resolution of a TDC circuit used in a PLL circuit having a digital controlled oscillation is corrected for;

FIG. 8 is an explanatory view showing the control of the switch to input one of two outputs from a TDC circuit to a first delay circuit;

FIG. 16 is an explanatory view showing calculation results of values in blocks based on the behavior model shown in FIG. 15.

DETAILED DESCRIPTION OF THE PREFERRED EMBODIMENTS

Figure 2:
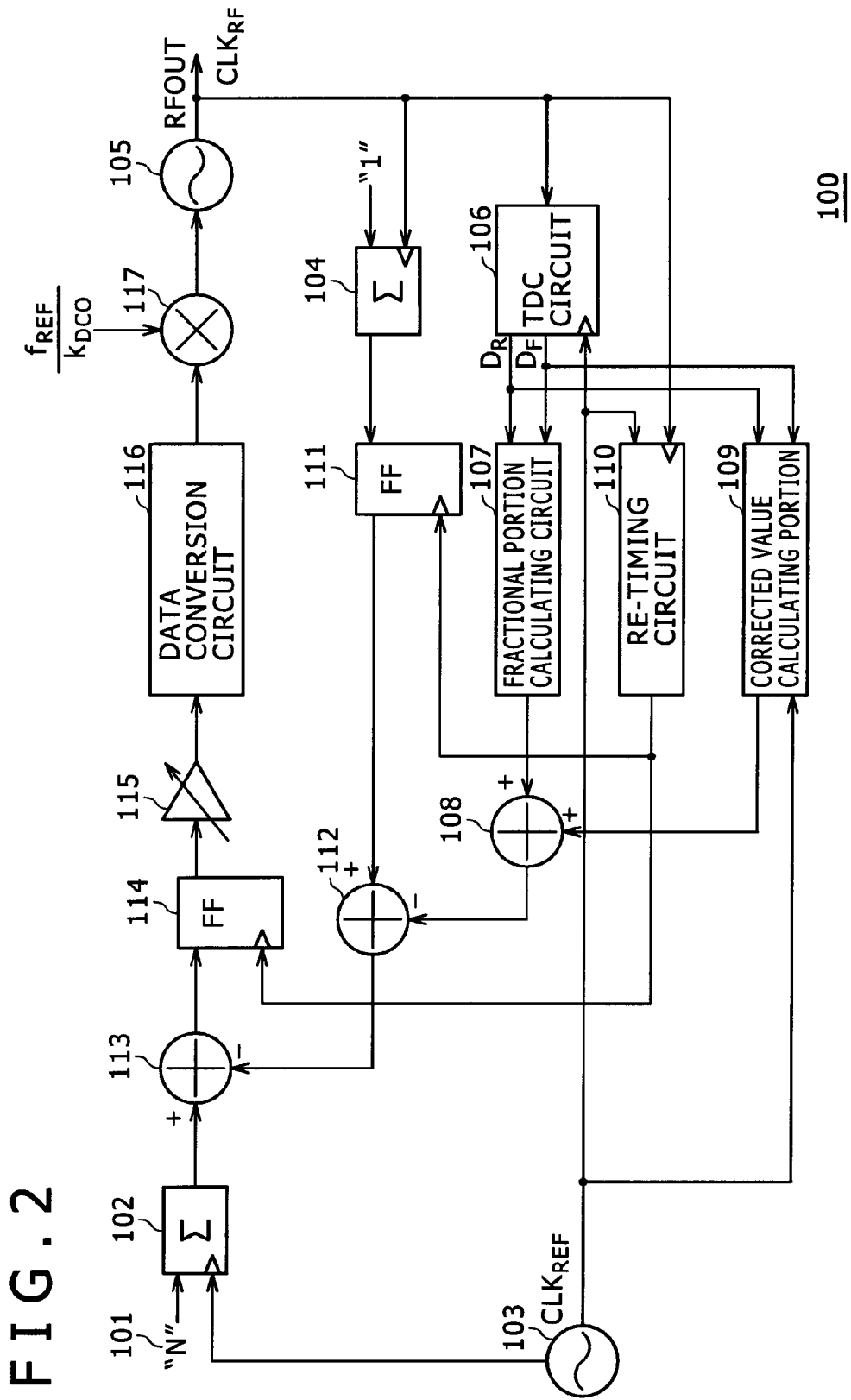
FIG. 2 is a block diagram, partly in circuit, showing a configuration of a PLL circuit according to a first embodiment of the present disclosure.

Embodiments of the present disclosure will be described in detail hereinafter with reference to the accompanying drawings. It is noted that in this specification and the drawings, constituent elements which have substantially the same functional constituent elements are designated by the same reference numerals or symbols, respectively, and thus a repeated description thereof is omitted for the sake of simplicity.

It is noted that the description will be given below in accordance with the following order:

1. Problems of Existing PLL Circuit;
2. First Embodiment;
   2-1. Calculation of Corrected Value
   2-2. Configuration of PLL Circuit
   2-3. Configuration of Corrected Value Calculating Portion
   2-4. Simulation Results
3. Second Embodiment;
   3-1. Configuration of PLL Circuit
   3-2. Functional Configuration of Activating Portion
4. Third Embodiment;
   4-1. Configuration of Corrected Value Calculating Portion
   4-2. Phase Comparison Processing
5. Fourth Embodiment;
   5-1. Configuration of Wireless Terminal Apparatus Including PLL Circuit; and
6. Conclusion.

1. PROBLEMS OF EXISTING PLL CIRCUIT

Figure 12:
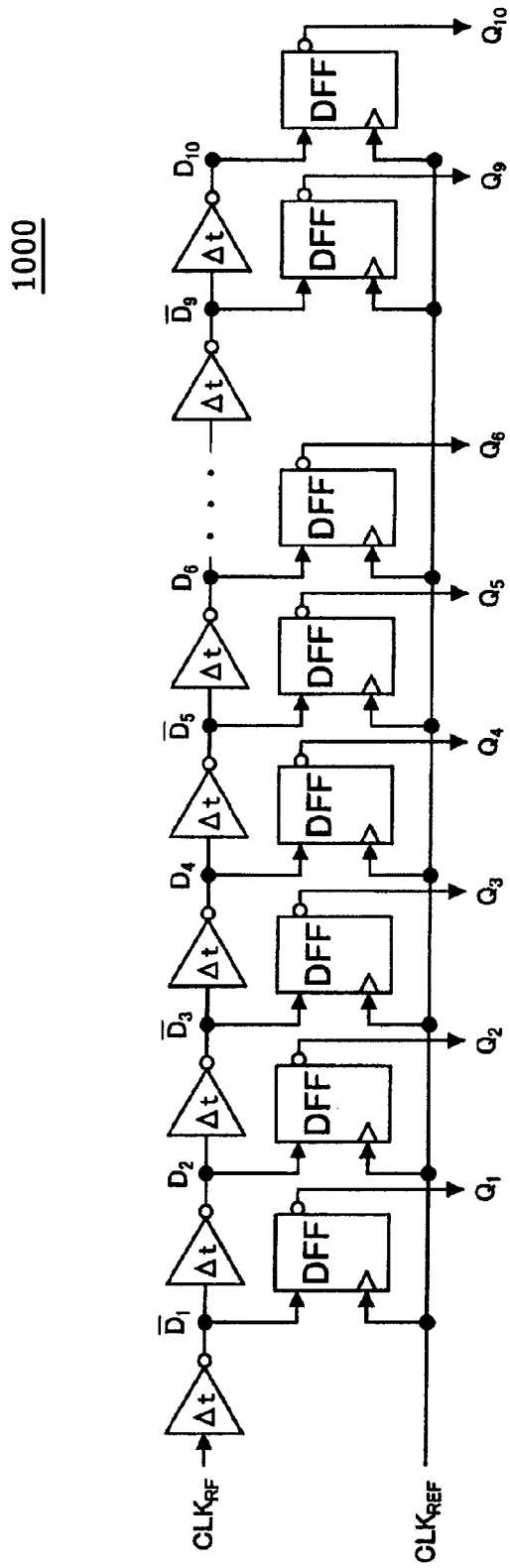
FIG. 12 is a block diagram, partly in circuit, showing a configuration of a general TDC circuit.
Figure 13:
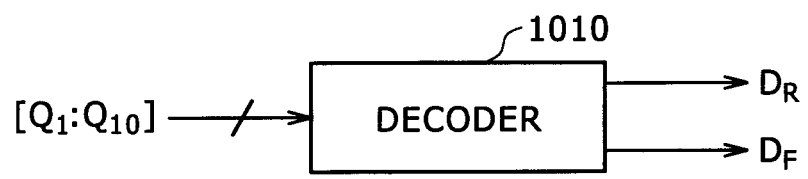
FIG. 13 is a block diagram showing a configuration of the general TDC circuit.

A TDC circuit used in detection of a fractional portion of the number of accumulated clocks of an output clock from a Digital Controlled Oscillator (DCO) has a finite resolution depending on the semiconductor process. FIG. 12 is a block diagram, partly in circuit, showing a configuration of a general TDC circuit, and FIG. 13 is a block diagram showing a configuration of the general TDC circuit. Hereinafter, the configuration of the general TDC circuit will be described with reference to FIGS. 12 and 13.

In the general TDC circuit 1000, elements, such as inverter circuits, each having a minute delay $\Delta t$ are connected in a cascade manner, and a clock having an oscillation frequency is inputted to the delay element. Output signals from the delay elements are held at a rising edge of a reference clock, and the data thus held is decoded in a decoder 1010. As a result, a time difference between a rising edge of the reference clock, and a rising edge of the clock having the oscillation frequency, or a time difference between the rising edge of the reference clock, and a falling edge of the clock having the oscillation frequency can be digitally converted.

Figure 14:
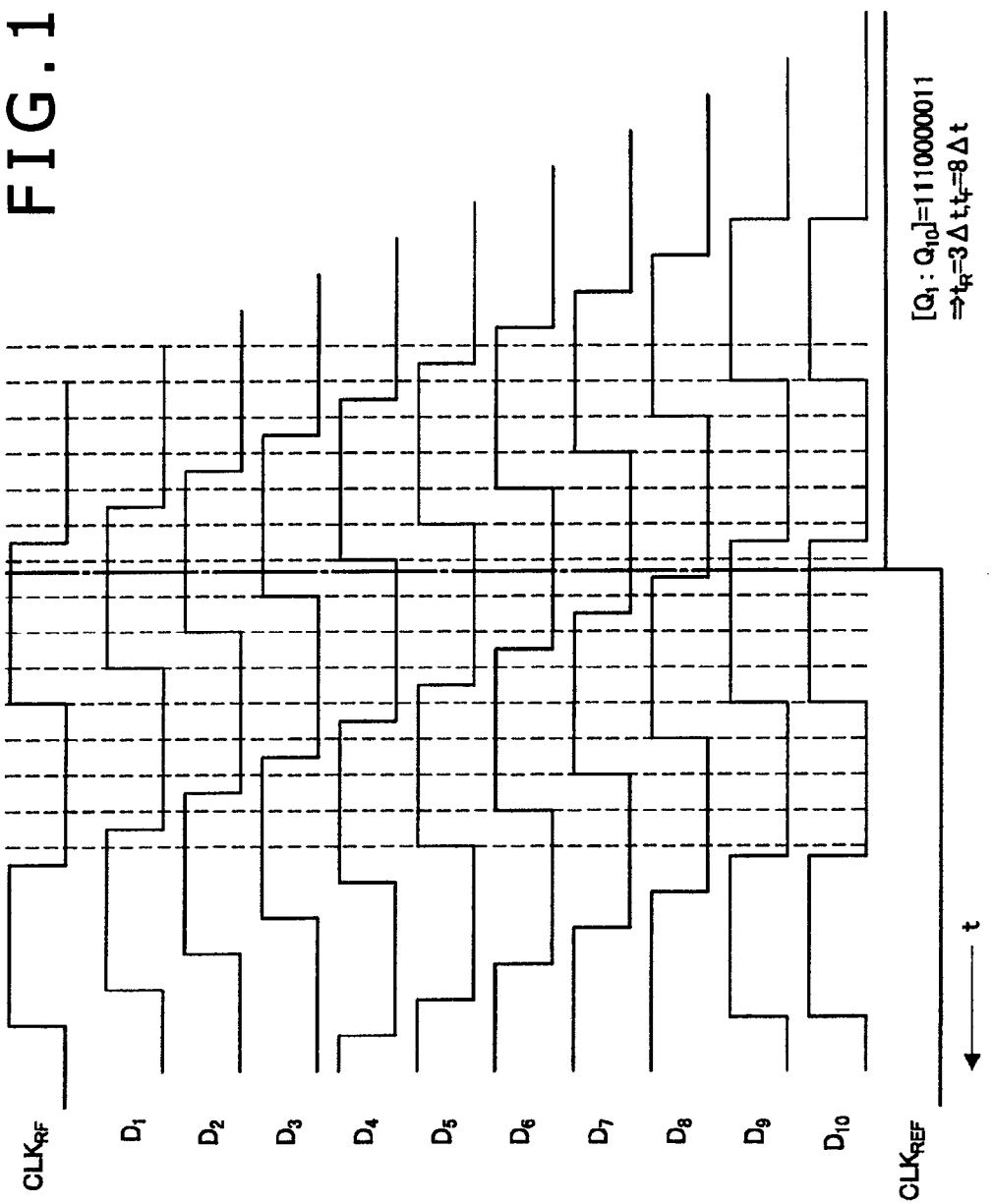
FIG. 14 is a timing chart showing digital conversion processing executed in the general TDC circuit.

FIG. 14 is a timing chart showing digital conversion processing in the general TDC circuit. Hereinafter, the digital conversion processing in the TDC circuit will be described with reference to FIG. 14. When an output clock $CLK_{RF}$ is inputted to the TDC circuit 1000 shown in FIG. 12, output signals $D_1$ to $D_{10}$ from the respective delay elements have waveforms which are delayed $\Delta t$ by $\Delta t$, respectively. When the waveforms are held at a rising edge of the output clock $CLK_{RF}$, digital data $[Q_1: Q_{10}]$ composed of output signals from flip flops $Q_1$ to $Q_{10}$ becomes "1110000011." The digital data is counted from the left-hand side in the decoder 1010. In this case, a point at which a digital value changes from 1 to 0 is given by $t_R$, and a point at which a digital value changes from 0 to 1 is given by $t_F$. In a word, in the example shown in FIG. 14, $t_R$ and $t_F$ are digitally converted into $t_R=3\Delta t$, and $t_F=8\Delta t$, respectively.

Figure 15:
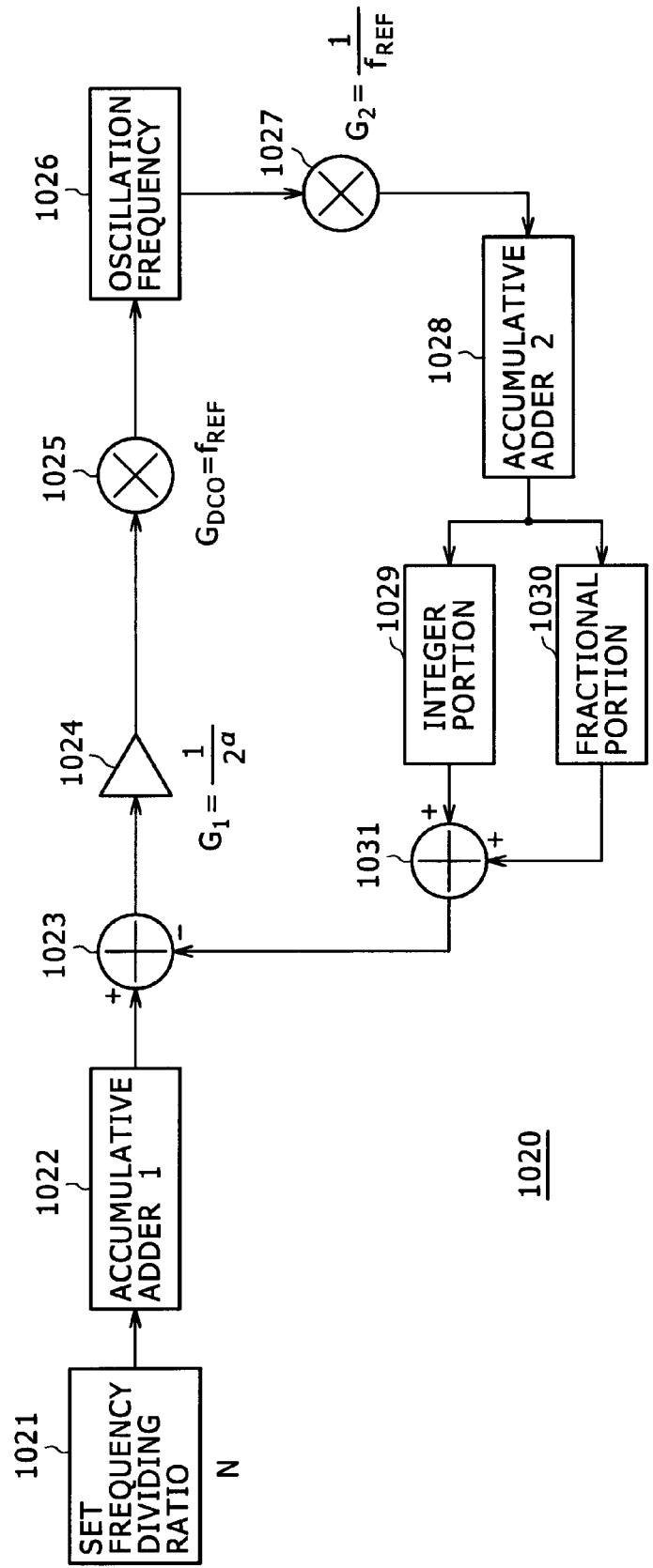
FIG. 15 is a block diagram, partly in circuit, showing a configuration of a behavior model of generation of a periodic error due to a resolution of the TDC circuit.

When a frequency dividing ratio having a small fractional portion is set in a PLL circuit using the TDC circuit, there is feared generation of a periodic error due to a resolution of the TDC circuit. A behavior model used for explanation of this phenomenon is shown in FIG. 15. FIG. 16 is an explanatory view showing calculation results of values in blocks based on the behavior model shown in FIG. 15. In this case, a limitation is given to a condition that a value of the fractional portion of the frequency dividing ratio is very small, and only an influence of the fractional portion is taken into consideration. Firstly, an initial value of a fractional portion of an accumulative adder 1 with an arithmetic operation period of 0 is given by $(\Delta t/T)\cdot(\alpha/M)$, and an initial value of a fractional portion of an accumulative adder 2 is given by $\Delta t/T$. Here, $\Delta t$ represents a time resolution of the TDC circuit, T represents a period of the oscillation frequency, M represents the number of divisions for $\Delta t/T$ of the fractional portion of a set frequency dividing ratio, and $\alpha$ represents an arbitrary integral value. Therefore, an adder output signal in the arithmetic operation period of 0 is given by $(\Delta t/T)\cdot\{(\alpha/M)-1\}$. In addition, when a variable gain circuit $(G_1=\frac{1}{2}^\alpha)$, and a DCO gain $(G_{DCO}=f_{ref})$ are both added, an error of the oscillation frequency is expressed by Expression (1):

$$-\frac{1}{2^\alpha}\cdot\frac{\Delta t}{T}\cdot\left(1-\frac{a}{M}\right)\cdot f_{ref} \quad (1)$$

Next, a fractional portion $(\alpha t/T)\cdot(1/M)$ obtained when the value $\Delta t/T$ in the arithmetic operation period of 0 is multiplied by a desired oscillation frequency $G_2$ ($=1/f_{ref}$), and a value obtained by multiplying the oscillation frequency error in the arithmetic operation period of 0 expressed by Expression (1) described above by $G_2$ are both added to the fractional portion of the accumulative adder 2 in the arithmetic operation period of 1. Here, the reason why the oscillation frequency error in the arithmetic operation period of 0 expressed by Expression (1) described above is multiplied by $G_2$ in a multiplier is because the addition processing in the accumulative adder 2 is expressed every reference clock $f_{ref}$. Therefore, the fractional portion of the accumulative adder 2 with the arithmetic operation period of 1 is expressed by Expression (2):

$$\frac{\Delta t}{T}\cdot\left\{1+\frac{1}{M}-\frac{1}{2^\alpha}\cdot\left(1-\frac{a}{M}\right)\right\} \quad (2)$$

After that, when this arithmetic operation is repetitively carried out, the fractional portion of the accumulative adder 2 in the arithmetic operation period of M is expressed by Expression (3):

$$\frac{\Delta t}{T}\cdot\left\{2-\frac{1}{2^\alpha}\cdot\left(M-\frac{M+2a-1}{2}\right)\right\} \quad (3)$$

Here, when a condition in which terms within a small bracket becomes zero is obtained in Expression (3) described above, $\alpha=(M+1)/2$ is obtained. The condition that the terms within the small bracket of the fractional portion of the accumulative adder 2 becomes zero is equivalent to that an average of the frequency errors over the M periods becomes zero. In a word, this means that the average of the oscillation frequency over M periods is controlled at a set frequency. Here, when an error of an adder output signal in the arithmetic operation period of M is calculated, the error of an adder output signal in the arithmetic operation period of M is expressed by Expression (4):

$$\frac{\Delta t}{T}\cdot\left(\frac{a}{M}-1\right) \quad (4)$$

It is understood from Expression (4) that the error of an adder output signal in the arithmetic operation period of M is equal to the error of the adder output signal in the arithmetic operation period of 0. From the above, it can be understood from the calculation that this operation is repetitively carried out with the period of M. Also, the error of the periodicity generates a spurious component $f_{ref}/M$.

Then, a PLL circuit which can correct for the periodic error generated due to the finite resolution of the TDC circuit used in the PLL circuit having the digital controlled oscillator will be described below in embodiments of the present disclosure.

2. FIRST EMBODIMENT

2-1. Calculation of Corrected Value

FIG. 1 is an explanatory view showing calculation of a corrected value when a periodic error generated due to a finite resolution of a TDC circuit used in a PLL circuit having a digital controlled oscillator according to a first embodiment of the present disclosure is corrected for. Hereinafter, the calculation of the corrected value when the periodic error is corrected for will be described with reference to FIG. 1.

Here, an initial value of a fractional portion of the number of accumulated clocks of the output clock from the oscillation circuit in the arithmetic operation period of M is given by $2\Delta t/T$, and an initial value of a fractional portion of the accumulated added value of the set frequency dividing ratio is given by $(\Delta t/T)\cdot\{(\alpha+M)/M\}$. In addition, a corrected value added to the fractional portion of the number of accumulated clocks of the output clock from the oscillation circuit is given by x. An output signal from a phase comparator in the arithmetic operation period of M is expressed by Expression (5):

$$\frac{\Delta t}{T}\cdot\frac{a+M}{M}-\left(\frac{2\cdot\Delta t}{T}+x_M\right) \quad (5)$$

Here, when a corrected value, $x_M$, with which the output signal from the phase comparator in the arithmetic operation period of M is made zero is obtained, the corrected value, $x_M$, is given by $(\Delta t/T)\times\{(\alpha)/M-1\}$. Likewise, corrected values in the respective arithmetic operation periods are obtained as follows:

$$x_{M+1}=\frac{\Delta t}{T}\cdot\left(\frac{a+1}{M}-1\right) \quad (6)$$

$$x_{M+2}=\frac{\Delta t}{T}\cdot\left(\frac{a+2}{M}-1\right)$$

$$\vdots$$

$$x_{2M}=\frac{\Delta t}{T}\cdot\left(\frac{a}{M}-1\right)$$

In a word, as apparent from the foregoing, it is understood that the corrected value is repeated with the period of M. When a starting point of periodicity of the arithmetic operation period is given by zero, and a corrected value in an arbitrary arithmetic operation, k, is given by $x_k$, Expression (7) is obtained as follows:

$$x_k=\frac{\Delta t}{T}\cdot\left(\frac{a+k}{M}-1\right)(0\leq k\leq M) \quad (7)$$

Therefore, in the arithmetic operation periods k, the corrected values, $x_k$, are continued to be added to the value of the fractional portion of the number of accumulated clocks of the oscillation circuit calculated by the utilizing the output signal from the TDC circuit, which results in that the output signal from the phase comparator can be continued to be corrected for so as to be set to zero.

The calculation of the corrected value when the periodic error generated due to the finite resolution of the TDC circuit used in the PLL circuit having the digital controlled oscillator has been described so far. Next, a description will be given with respect to a configuration of the PLL circuit according to the first embodiment of the present disclosure.

2-2. Configuration of PLL Circuit

FIG. 2 is a block diagram, partly in circuit, showing a configuration of a PLL circuit 100 according to a first embodiment of the present disclosure. Hereinafter, a description will be given with respect to the configuration of the PLL circuit 100 according to the first embodiment of the present disclosure with reference to FIG. 2.

As shown in FIG. 2, the PLL circuit 100 according to the first embodiment of the present disclosure includes a first accumulative adder 102, a first reference clock oscillation circuit 103, a second accumulative adder 104, an oscillation circuit 105, a TDC circuit 106, a fractional portion calculating circuit 107, a first adder 108, a corrected value calculating portion 109, and a re-timing circuit 110. Also, the PLL circuit 100 includes a first flip flop 111, a second adder 112, a third adder 113, a second flip flop 114, a variable gain circuit 115, a data conversion circuit 116, and a multiplier 117.

The first accumulative adder 102 accumulatively adds a set frequency driving ratio "N" 101 represented as a digital value every rising edge of a first reference clock $CLK_{REF}$ from the first reference clock oscillation circuit 103. The second accumulative adder 104 accumulatively adds a value "1" every rising edge of an output clock $CLK_{RF}$ from the oscillation circuit 105. In a word, the second accumulative adder 104 serves as a circuit for counting the number of clocks of the output clock $CLK_{RF}$ from the oscillation circuit 105.

The TDC circuit 106 is a circuit for digitizing a time difference between the rising edge of the output clock $CLK_{RF}$ from the oscillation circuit 105 and the rising edge of the first reference clock $CLK_{REF}$ from the first reference clock oscillation circuit 103, and a time difference between the falling edge of the output clock $CLK_{RF}$ from the oscillation circuit 105 and the rising edge of the first reference clock $CLK_{REF}$ from the first reference clock oscillation circuit 103. The fractional portion calculating circuit 107 calculates a fractional portion from $D_R$ and $D_F$ obtained through the digitizing in the TDC circuit 106 in accordance with Expression (8). It is noted that for obtaining $D_T$, the values calculated for the periods of the first reference clock $CLK_{REF}$ from the first reference clock oscillation circuit 103 may be averaged for a given period of time, and the value obtained through the averaging may be updated on a steady basis to be utilized for calculation in Expression (8):

$$Frac = 1 - \frac{D_R}{D_T} \quad (8)$$

where $D_T = 2 \cdot |D_R - D_F|$.

The fractional portion becomes a fractional portion of the number of accumulated clocks of the output clock $CLK_{RF}$ from the oscillation circuit 105. The first adder 108 adds the corrected value calculated in the corrected value calculating portion 109 to the fractional portion calculated in accordance with Expression (8) described above. The re-timing circuit 110 generates a second reference clock obtained by making re-timing for the first reference clock $CLK_{REF}$ from the first reference clock oscillation circuit 103 at the rising edge of the output clock $CLK_{RF}$ from the oscillation circuit 105.

The first flip flop 111 holds therein the output signal from the second accumulative adder 104 at the rising edge of the second reference clock obtained through the re-timing. This is equivalent to that when the number of accumulated clocks of the output clock $CLK_{RF}$ from the oscillation circuit 105 is displayed with a decimal point, an integral value obtained by rounding up the fractional portion thereof is calculated.

The second adder 112 subtracts a value obtained by adding the corrected value calculated in the corrected value calculating portion 109 to the fractional portion calculated in accordance with Expression (8) described above from the output signal from the first flip flop 111. An output signal from the second adder 112 becomes a digital value of the number of accumulated clocks, of the output clock $CLK_{RF}$ from the oscillation circuit 105, which is displayed with the decimal point. Thus, the third adder 113 subtracts the digital value of the number of accumulated clocks, of the output clock $CLK_{RF}$ from the oscillation circuit 105, which is displayed with the decimal point from the output signal from the first accumulative adder 102 for accumulatively adding the set frequency dividing ratio "N" 101 represented as the digital value. In a word, since the number of accumulated clocks, as the reference, which is displayed with the decimal point, and the number of accumulated clocks, of the output clock $CLK_{RF}$ from the oscillation circuit 105, which is displayed with the decimal point are compared with each other, the third adder 113 carries out the same operation as that of a phase comparator.

The second flip flop 114 holds therein the output signal from the third adder 113 at the rising edge of the second reference clock obtained through the re-timing. The output signal from the third adder 113 is level-converted in the variable gain circuit 115. A digital value corresponding to a phase error which is level-converted in the variable gain circuit 115 is converted in the data conversion circuit 116. The data conversion circuit 116, as an example of the data conversion, carries out the data conversion expressed by Expression (9):

$$y = x - \frac{A}{2^\alpha} + N \quad (9)$$

where x represents an input value, A represents a midpoint of an output variable range in unsigned of the third adder 113, $\frac{1}{2}^\alpha$ represents a gain of the variable gain circuit 115, N represents a frequency dividing ratio, and y represents an output value.

The output value, y, from the data conversion circuit 116 is converted into a digital value with the frequency dividing ratio N as a reference by the data conversion in the data conversion circuit 116. Note that, it goes without saying that the data conversion in Expression (9) is merely an example, and thus the present disclosure is by no means limited thereto as long as the data conversion which is carried out with the frequency dividing ratio N as the reference is adopted. For example, a change such as insertion of a transfer function of a filter may be carried out.

The multiplier 117 is used to normalize the conversion gain of the oscillation circuit 105 and multiplies the output signal from the data conversion circuit 116 by $f_{REF}/k_{DCO}$. Here, $f_{REF}$ is a frequency value of the first reference clock $CLK_{REF}$ from the first reference clock oscillation circuit 103, and $k_{DCO}$ is the conversion gain of the oscillation circuit 105.

From the foregoing, the phase error difference component detected by the third adder 113 operating as the phase comparator is data-converted into a value with the frequency dividing ratio N as a reference. The oscillation circuit 105 is digitally controlled by using the value obtained through the data conversion, which results in that the circuit 100 shown in FIG. 2 operates as the PLL circuit.

The configuration of the PLL circuit 100 according to the first embodiment of the present disclosure has been described so far. Next, a description will be given with respect to a configuration of the corrected value calculating portion 109 included in the PLL circuit 100 according to the first embodiment of the present disclosure.

2-3. Configuration of Corrected Value Calculating Portion

Figure 3:
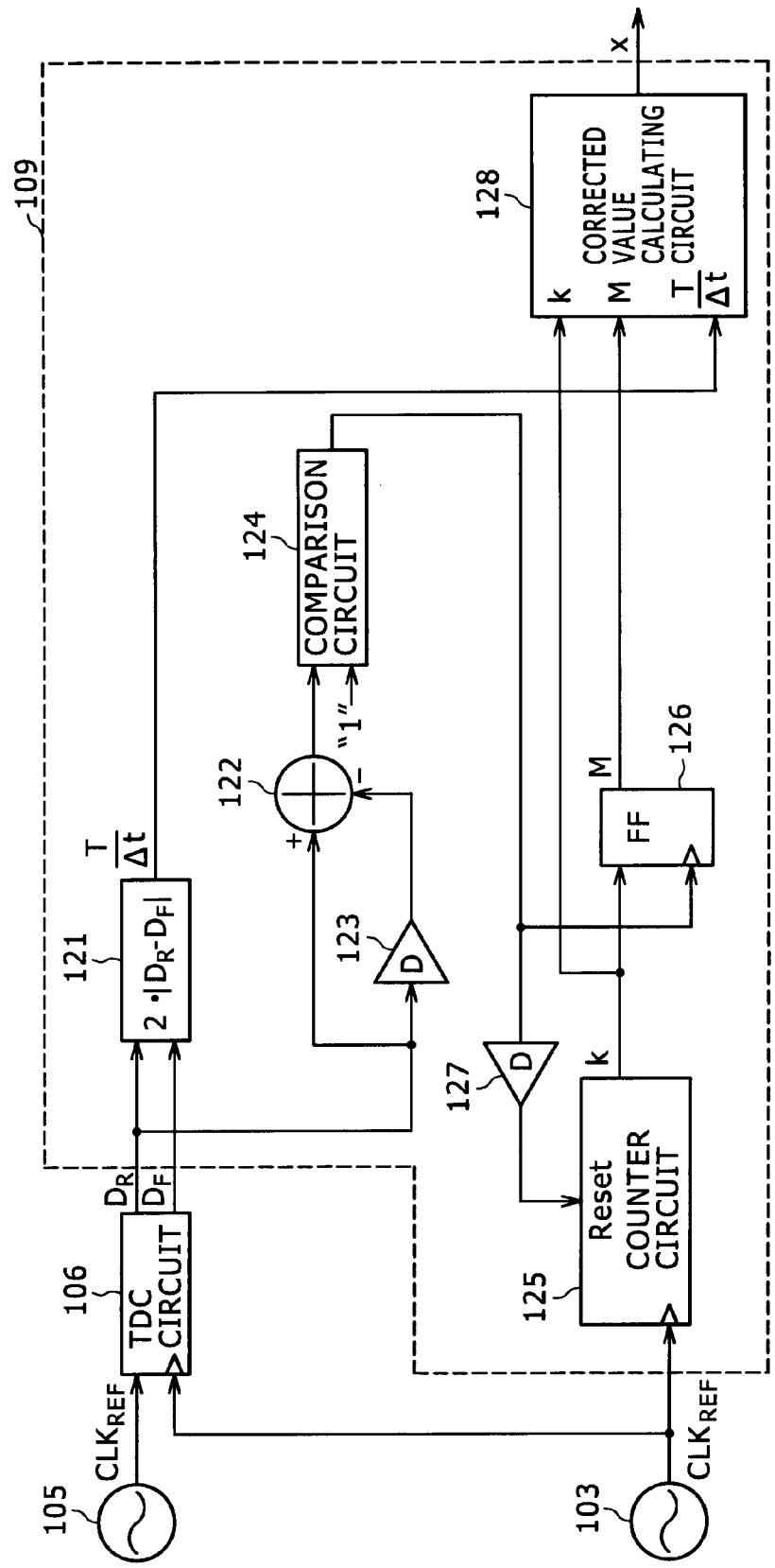
FIG. 3 is a block diagram, partly in circuit, showing a configuration of a corrected value calculating portion included in the PLL circuit according to the first embodiment of the present disclosure.

FIG. 3 is a block diagram, partly in circuit, showing a configuration of the corrected value calculating portion 109 included in the PLL circuit 100 according to the first embodiment of the present disclosure. Hereinafter, a description will be given with respect to the configuration of the corrected value calculating portion 109 included in the PLL circuit 100 according to the first embodiment of the present disclosure with reference to FIG. 3.

As shown in FIG. 3, the corrected value calculating portion 109 included in the PLL circuit 100 according to the first embodiment of the present disclosure includes a period detecting circuit 121, an adder 122, a first delay circuit 123, a first comparison circuit 124, a counter circuit 125, a flip flop 126, a second delay circuit 127, and a corrected value calculating circuit 128.

The output clock $CLK_{RF}$ from the oscillation circuit 105 which is a Digital Controlled Oscillator (DCO) is inputted to the TDC circuit 106, and is triggered with the first reference clock $CLK_{REF}$ from the first reference clock oscillation circuit 103. Also, the TDC circuit 106 digitally converts a time difference between a rising edge of the output clock $CLK_{RF}$ from the oscillation circuit 105, and a rising edge of the first reference clock $CLK_{REF}$ from the first reference clock oscillation circuit 103, and outputs the resulting digital value $D_R$. In addition, the TDC circuit 106 digitally converts a time difference between a falling edge of the output clock $CLK_{RF}$ from the oscillation circuit 105, and the rising edge of the first reference clock $CLK_{REF}$ from the first reference clock oscillation circuit 103, and outputs the resulting digital value $D_F$.

The period detecting circuit 121 for the output clock $CLK_{RF}$ from the oscillation circuit 105 calculates a digital value of one period from the digital values $D_R$ and $D_F$ both detected by the TDC circuit 106. The digital value of one period is given by $T/\Delta t$.

The adder 122 subtracts a value obtained by delaying a time D by the first delay circuit 123 from the digital value $D_R$ outputted from the TDC circuit 106.

The first comparison circuit 124 compares the output signal from the adder 122, and a value "1" with each other. The first comparison circuit 124 outputs a signal having a polarity "H" when the output signal from the adder 122 is "1," and outputs a signal having a polarity "L" when the output signal from the adder 122 is a value other than "1." In a word, the first comparison circuit 124 outputs a strobe signal corresponding to a period "H" of time for a delay time D in the first delay circuit 123 when the output digital signal value $D_R$ from the TDC circuit 106 changes by "+1."

The counter circuit 125 counts the number of clocks of the first reference clock $CLK_{REF}$ from the first reference clock oscillation circuit 103. In a phase of the rising of the strobe signal outputted from the first comparison circuit 124, in a word, at a timing at which the output digital signal value $D_R$ from the TDC circuit 106 changes by "+1," the output signal from the counter circuit 125 is fetched in the flip flop 126. In a word, the data on the arithmetic operation period of M shown in FIG. 1 is fetched in the flip flop 126. The second delay circuit 127 is used for the purpose of resetting the counter circuit 125 by using the strobe signal described above after the output signal from the counter circuit 125 has been reliably fetched in the flip flop 126. With such a configuration, the counter circuit 125 becomes a counter circuit which operates with the period M.

The corrected value calculating circuit 128 is a circuit for calculating the corrected value x. The output signal $T/\Delta t$ from the period detecting circuit 121 for the output clock $CLK_{RF}$ from the oscillation circuit 105, the data on the arithmetic operation period of M held by the flip flop 126, and the data on the arithmetic operation periods of k as output signals from the counter circuit 125 are all inputted to the corrected value calculating circuit 128. Thus, a corrected value is calculated which is to be added to the fractional portion of the number of accumulated clocks of the output clock from the oscillation circuit calculated by using both of the output digital signal values $D_R$ and $D_F$ from the TDC circuit 106. It should be noted that although in FIG. 3, the output digital signal value $D_R$ is used for generation of the strobe signal, the present disclosure is by no means limited thereto, and thus it goes without saying that the output digital signal value $D_F$ can also be used. In addition, the circuit configuration with which the same processing is executed is by no means limited to the configuration shown in FIG. 3.

The configuration of the corrected value calculating portion 109 included in the PLL circuit 100 according to the first embodiment of the present disclosure has been described so far with reference to FIG. 3. Next, a description will be given with respect to simulation results made by using the PLL circuit 100.

2-4. Simulation Results

Figure 4A:
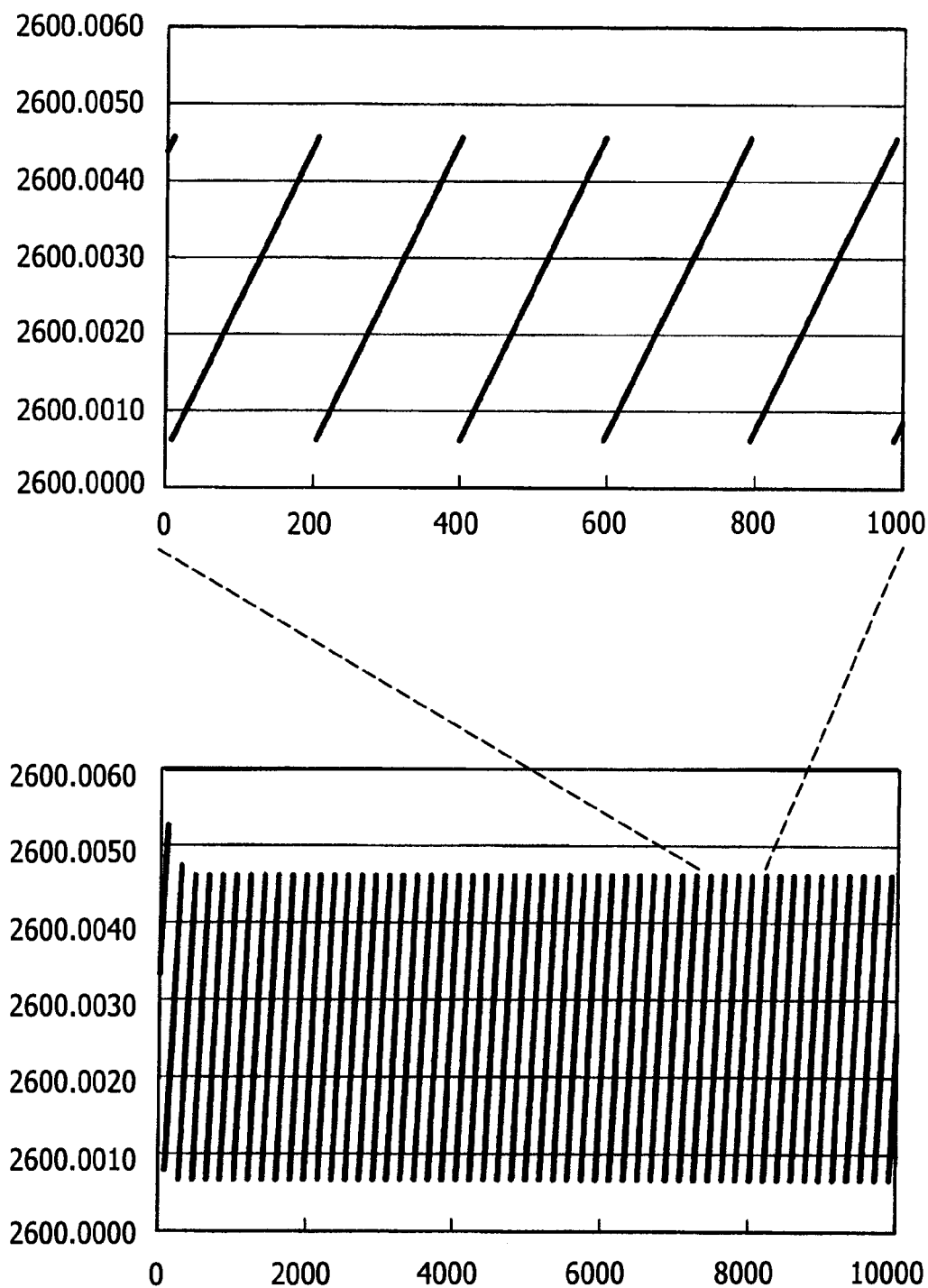
FIG. 4A is a graphical representation representing a simulation result in which a corrected value obtained by the PLL circuit according to the first embodiment of the present disclosure is not added.
Figure 4B:
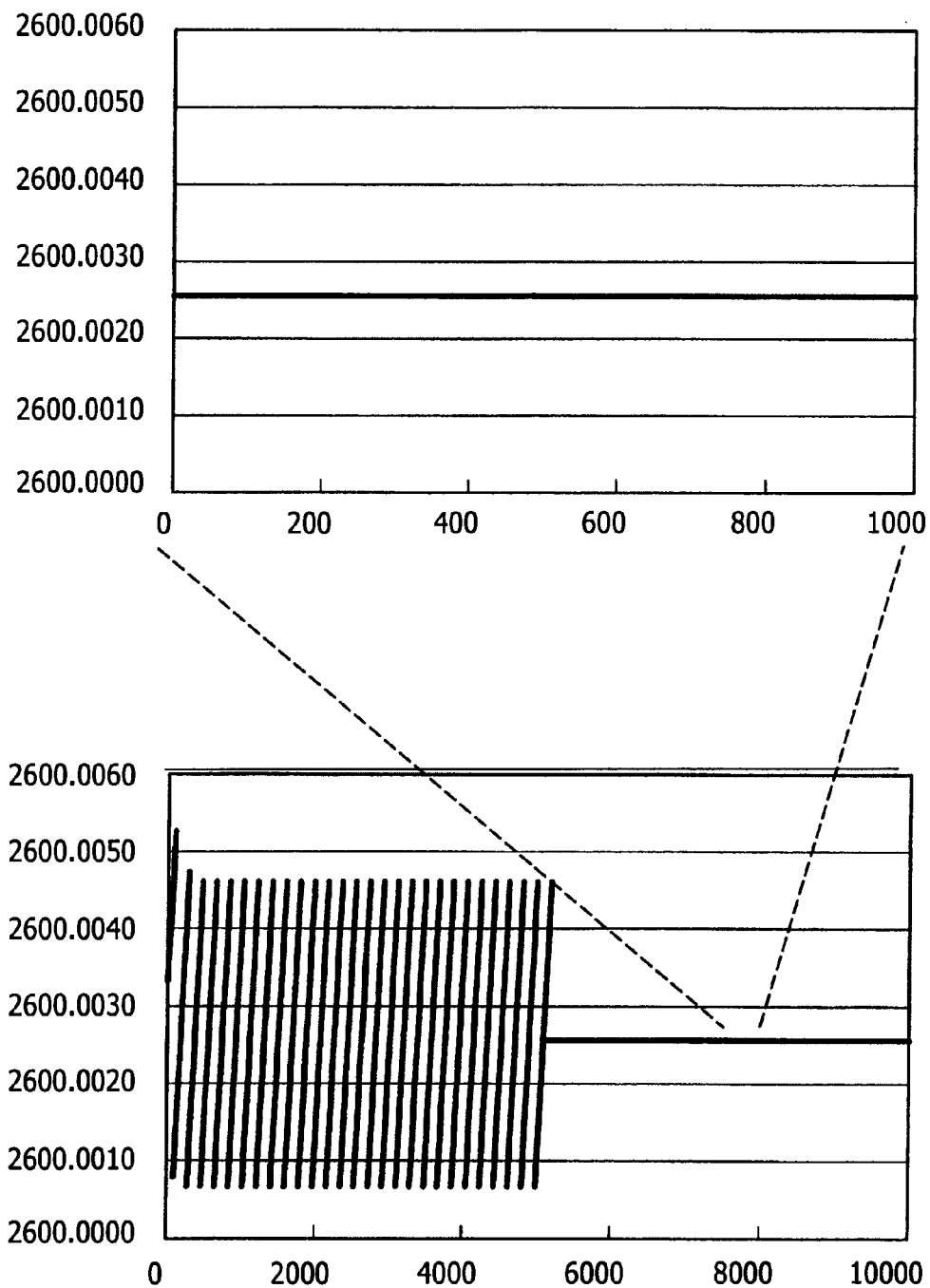
FIG. 4B is a graphical representation representing a simulation result in which the corrected value obtained by the PLL circuit according to the first embodiment of the present disclosure is added.

FIG. 4A is a graphical representation showing simulation results to which a corrected value made by using the PLL circuit 100 according to the first embodiment of the present disclosure is not added by using a behavior model of the PLL circuit shown in FIG. 14. Also, FIG. 4B is a graphical representation showing simulation results to which the corrected value made by using the PLL circuit 100 according to the first embodiment of the present disclosure is added by using the behavior model of the PLL circuit shown in FIG. 14. Here, the set values are set in such a way that the frequency dividing ratio N=100.001, the reference clock frequency $f_{REF}$=26 MHz, the delay amount, $\Delta t$, of the delay element used in the TDC circuit=7.5 ps, and the gain $G_1$ of the variable gain circuit=$\frac{1}{2^7}$.

With these set values, the period M becomes about 195. Each of the lower parts of FIGS. 4A and 4B shows the simulation results over 10,000 periods. Also, each of the upper parts of FIGS. 4A and 4B enlarges 7,500 to 8,500 periods. As apparent from these simulation results, it is understood that when the fractional portion of the frequency dividing ratio N is small, an influence of a periodic error is exerted on oscillation frequency values.

FIG. 4B shows the simulation results when the corrected value is added after 5,000 periods in which the sufficient convergence is obtained. Up to 5,000 periods in which no corrected value is added, similarly to the case of FIG. 4A, the influence of the periodic error can be confirmed. However, it is possible to confirm that the influence of the periodic error is reduced in and after 5,000 periods in which the corrected value is added.

From the foregoing, it is possible to confirm that the corrected value is calculated in the corrected value calculating portion 109 included in the PLL circuit 100 according to the first embodiment of the present disclosure, and is then added to the fractional portion of the number of accumulated clocks, which is effective in reduction of the influence of the periodic error generated due to the finite resolution of the TDC circuit and generated due to the condition having the small fractional portion of the frequency dividing ratio.

3. SECOND EMBODIMENT

3-1. Configuration of PLL Circuit

Figure 5:
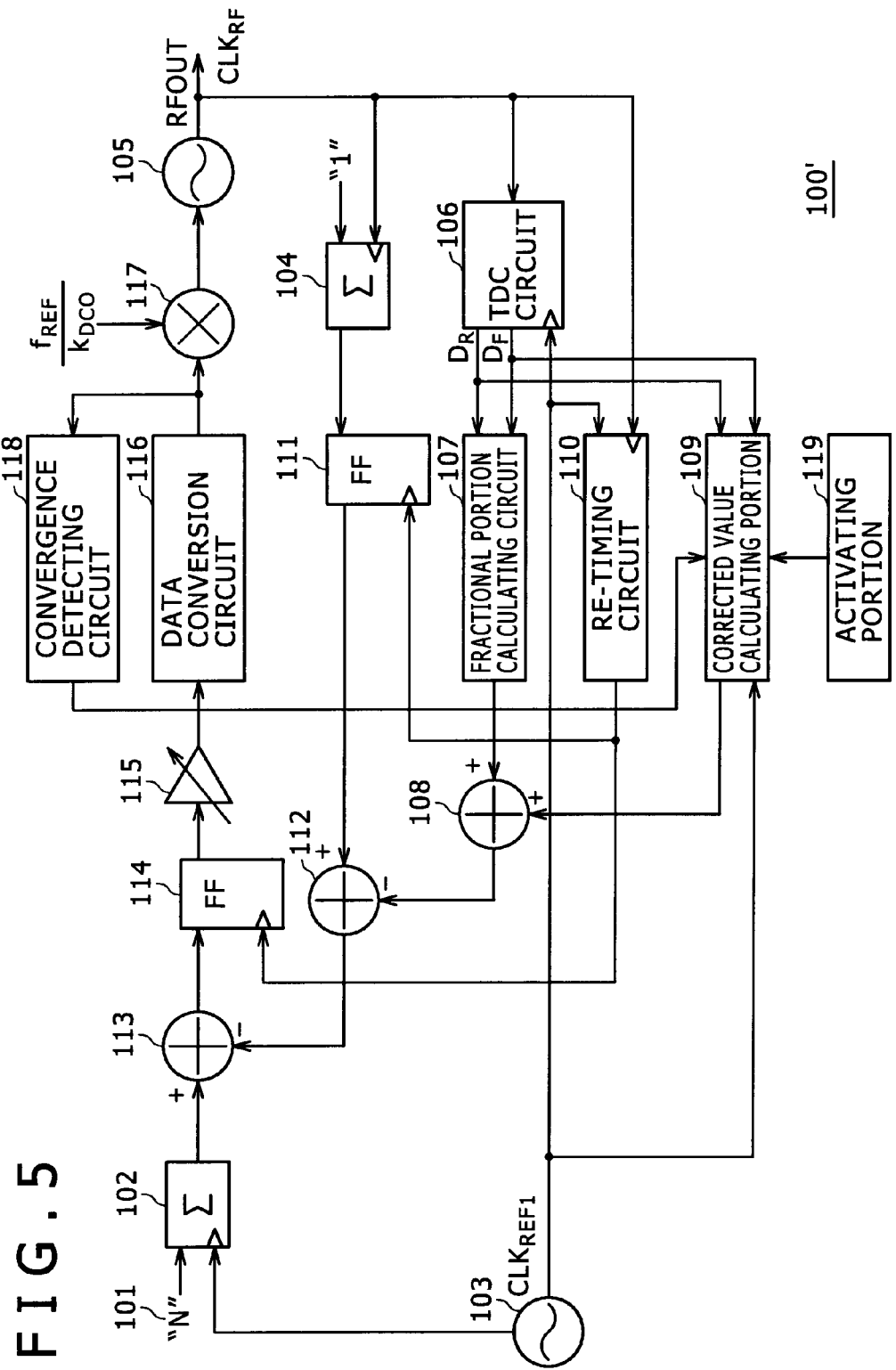
FIG. 5 is a block diagram, partly in circuit, showing a configuration of a PLL circuit according to a second embodiment of the present disclosure.

Next, a second embodiment of the present disclosure will be described in detail. FIG. 5 is a block diagram, partly in circuit, showing a configuration of a PLL circuit 100' according to the second embodiment of the present disclosure. For the purpose of avoiding a duplication of the description given with reference to FIG. 2, a description will be given below with respect to a difference with the PLL circuit 100 shown in FIG. 2.

The PLL circuit 100' according to the second embodiment of the present disclosure shown in FIG. 5 has a configuration in which both of a convergence detecting circuit 118 and an activating portion 119 are added to the PLL circuit 100 shown in FIG. 2.

The convergence detecting circuit 118 monitors an output signal from the data conversion circuit 116, thereby detecting the degree of convergence of the output signal from the data conversion circuit 116. The convergence detecting circuit 118 is a circuit for regarding the output signal from the data conversion circuit 116 as being converged when a difference between an input signal and the set frequency dividing ratio "N" 101, and a change over an arithmetic operation period of the input signal become equal to or smaller than arbitrary threshold values. After the convergence detecting circuit 118 has detected the convergence in the PLL circuit 100', a control signal is sent to the corrected value calculating portion 109 to thereby turn the corrected value calculating portion 109 ON.

The activating portion 119 generates the control signal to turn the corrected value calculating portion 109 ON, and outputs the control signal to the corrected value calculating portion 109. A configuration of the activating portion 119 will be described below in detail.

3-2. Functional Configuration of Activating Portion

Figure 6:
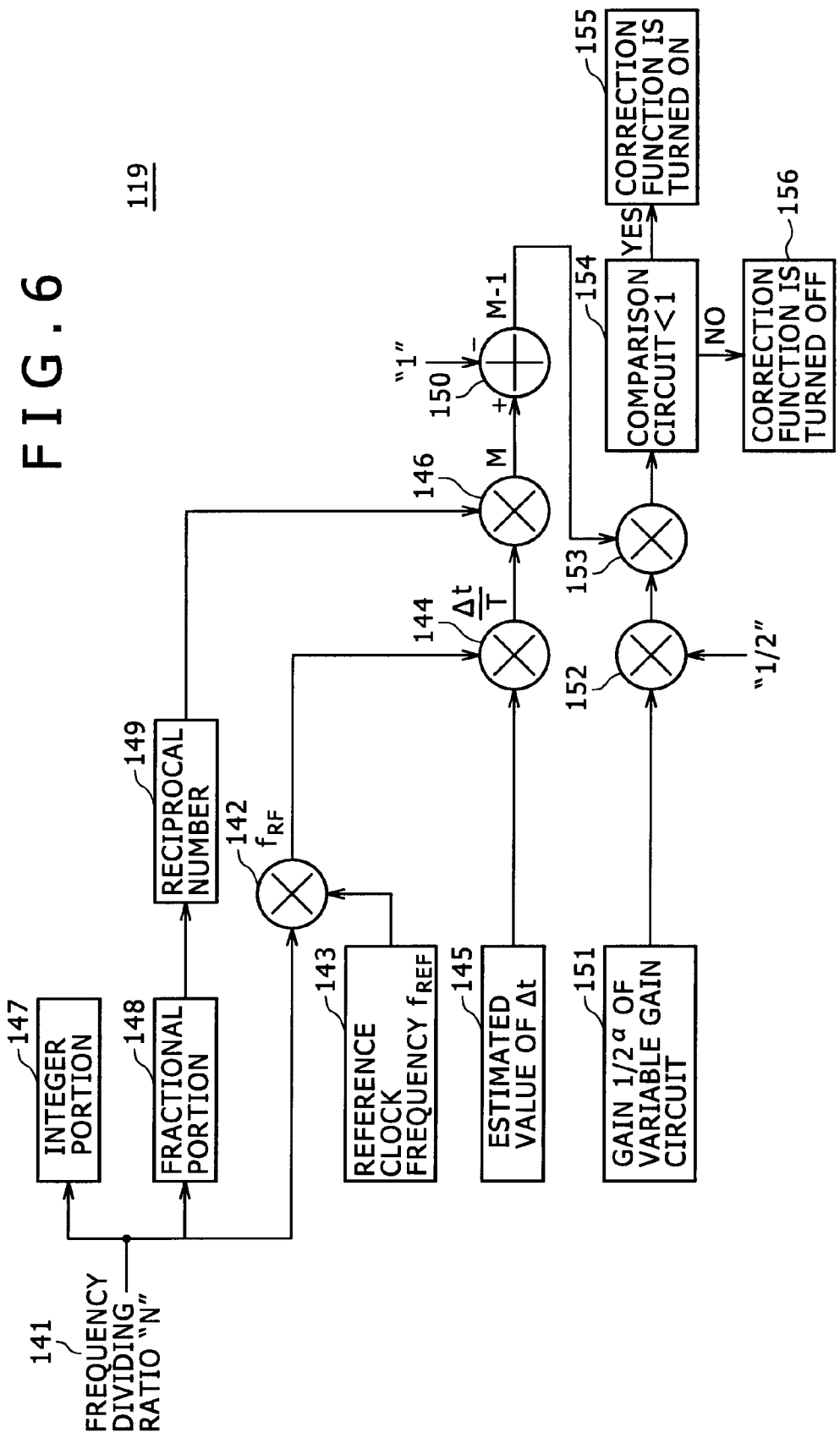
FIG. 6 is a block diagram, partly in circuit, showing a configuration of an activating portion included in the PLL circuit according to the second embodiment of the present disclosure.

FIG. 6 is a block diagram, partly in circuit, showing the configuration of the activating portion 119 included in the PLL circuit 100' according to the second embodiment of the present disclosure. As described above, the activating portion 119 turns ON or OFF the correction function. That is to say, the activating portion 119 generates the control signal to turn the corrected value calculating portion 109 ON or OFF.

The digitally represented set frequency dividing ratio "N" 141 is multiplied by a frequency value 143 of a first reference clock in a first multiplier 142, thereby obtaining a desired oscillation frequency value $f_{RF}$. In addition, a second multiplier 144 multiplies an estimated value 145 of $\Delta t$ by an output signal from the first multiplier 142 as the desired oscillation frequency value $f_{RF}$. In a word, an output signal from the second multiplier 144 becomes $\Delta t/T$. It is noted that for calculation of $\Delta t/T$, a constitution for calculating a reciprocal number of the value detected in the periodicity detecting circuit 121 shown in FIG. 3 may also be adopted.

A third multiplier 146 multiplies the output signal from the second multiplier 144 by a reciprocal number 149 of a fractional portion 148 of the set frequency dividing ratio "N" 141 represented as the digital value. In a word, from the relationship shown in FIG. 15, an output signal from the third multiplier 146 becomes M.

An adder 150 subtracts 1 from the output signal M from the third multiplier 146 to obtain (M−1). When a gain 151 of a variable gain circuit for controlling a loop band is given by $1/2^{\alpha}$, the gain 151 of the variable gain circuit is multiplied by $1/2$ in a fourth multiplier 152, thereby obtaining $1/2^{(\alpha+1)}$. Note that, it goes without saying that a bit shift circuit can be substituted for the fourth multiplier 152.

A fifth multiplier 153 multiplies the output signal, $1/2^{(\alpha+1)}$, from the fourth multiplier 152 by the output signal (M−1) from the adder 150. As a result, the fifth multiplier 153 obtains an output signal $(M-1)/2^{(\alpha+1)}$.

A comparison circuit 154 carries out comparison about whether or not the output signal $(M-1)/2^{(\alpha+1)}$ from the fifth multiplier 153 is smaller than 1. When the output signal $(M-1)/2^{(\alpha+1)}$ from the fifth multiplier 153 is smaller than 1, a control signal 155 is outputted to turn the correction function ON. On the other hand, when the output signal $(M-1)/2^{(\alpha+1)}$ from the fifth multiplier 153 is equal to or larger than 1, a control signal 156 is outputted to turn the correction function OFF. Here, the fractional portion of the accumulative adder 2 in the arithmetic operation period 1 shown in FIG. 15 was expressed by Expression (2) described above.

A condition that a sum in and after a second term within a curly bracket in Expression (2) is obtained as follows so as for errors in the arithmetic operation periods to be accumulated in a positive direction:

$$\frac{1}{M} - \frac{1}{2^{\alpha}} \cdot \left(1 - \frac{a}{M}\right) > 0 \quad (10)$$

$$\frac{1}{M} - \frac{1}{2^{\alpha}} \cdot \left(1 - \frac{M+1}{2M}\right) > 0$$

$$\frac{M-1}{2^{\alpha+1}} < 1$$

In a word, the activating portion 119 shown in FIG. 6 is a circuit for generating the control signal to turn the correction function ON only when the condition expressed by Expression (10) is fulfilled.

Note that, although in the second embodiment, the third multiplier 146 is used, it goes without saying that in the present disclosure, the output signal M from the flip flop 126 shown in FIG. 3 may be used instead of using the output signal M of the third multiplier 146.

4. THIRD EMBODIMENT

4-1. Configuration of Corrected Value Calculating Portion

Figure 7:
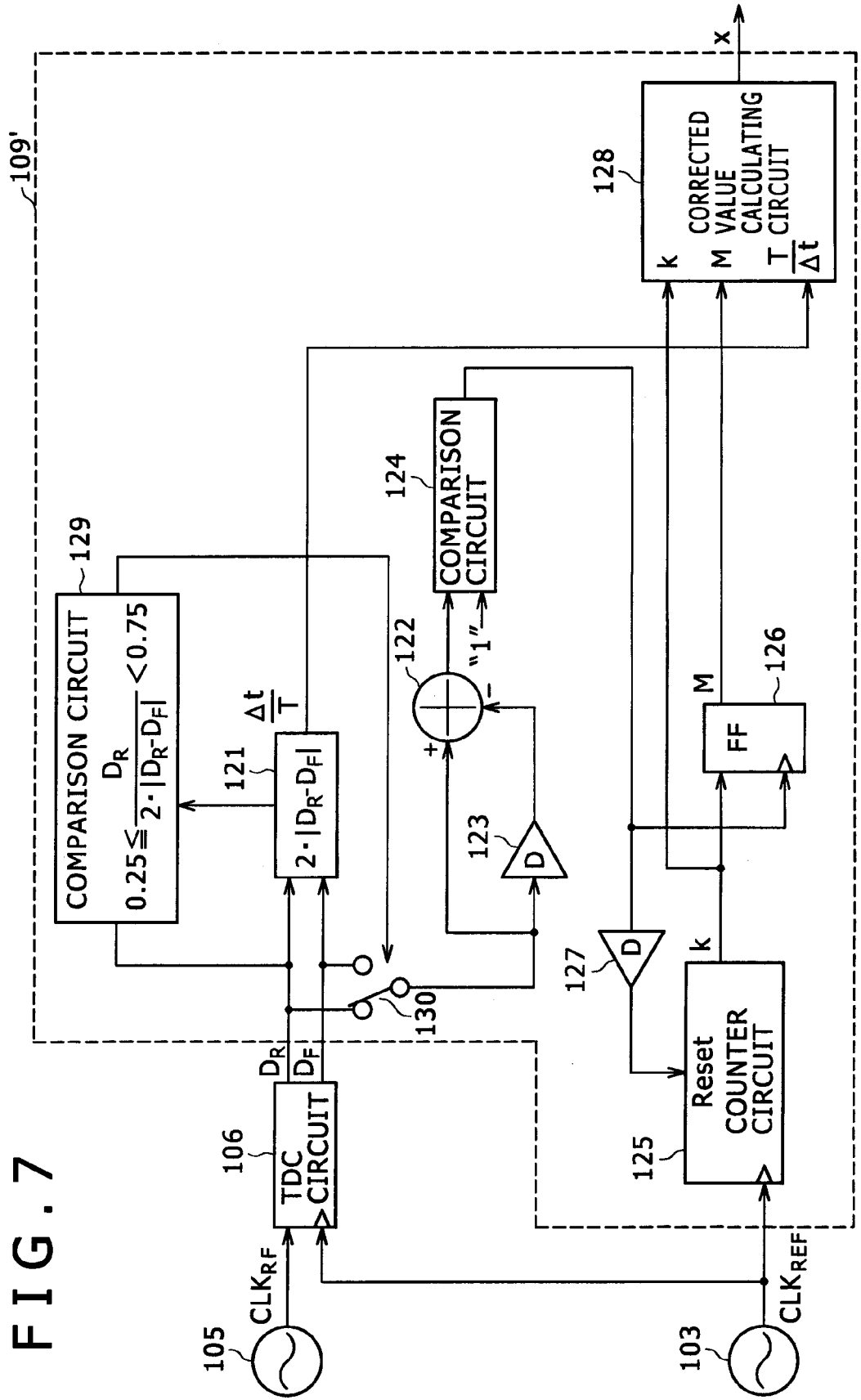
FIG. 7 is a block diagram, partly in circuit, showing a configuration of a corrected value calculating portion included in a PLL circuit according to a third embodiment of the present disclosure.

Next, a third embodiment of the present disclosure will be described. FIG. 7 is a block diagram, partly in circuit, showing a configuration of a corrected value calculating portion 109' included in a PLL circuit according to the third embodiment of the present disclosure. Hereinafter, a description will be given with respect to the configuration of the corrected value calculating portion 109' included in the PLL circuit according to the third embodiment of the present disclosure with reference to FIG. 7.

For the purpose of avoiding a duplication of the description given with reference to FIG. 3, a description will be given below with respect to a difference with the corrected value calculating portion 109 included in the PLL circuit 100 according to the first embodiment of the present disclosure shown in FIG. 3.

The corrected value calculating portion 109' shown in FIG. 7 has a configuration in which both of a second comparison circuit 129 and a switch 130 are added to the corrected value calculating portion 109 shown in FIG. 3.

The second comparison circuit 129 calculates $D_R/(2 \cdot |D_R - D_F|)$ from both of the digital value $D_R$ as the output signal from the TDC circuit 106 and $2 \cdot |D_R - D_F|$ as the output signal from the periodicity detecting circuit 121 for the output clock from the digital controlled oscillator 105, and detects whether or not a value of $D_R/(2 \cdot |D_R - D_F|)$ falls within a predetermined range (equal to or larger than 0.25 and smaller than 0.75). When it is detected that the value of $D_R/(2 \cdot |D_R - D_F|)$ is equal to or larger than 0.25 and smaller than 0.75, the switch 130 is controlled in such a way that the output signal $D_R$ from the TDC circuit 106 is inputted to the first delay circuit 123. On the other hand, when it is detected that the value of $D_R/(2 \cdot |D_R - D_F|)$ is smaller than 0.25 or is equal to or larger than 0.75, the switch 130 is controlled in such a way that the output signal $D_F$ from the TDC circuit 106 is inputted to the first delay circuit 123.

FIG. 8 is an explanatory view showing the control of the switch 103 to input one of the two output signals $D_R$ and $D_F$ from the TDC circuit 106 to the first delay circuit 123.

Since in the arithmetic operation period x, $D_R=12$ and $D_F=6$, the value of $D_R/(2 \cdot |D_R - D_F|)$ becomes 1. Therefore, the switch 130 is controlled by the second comparison circuit 129 so as to select the output signal $D_F$. On the other hand, since in the arithmetic operation period (x+1), $D_R=3$ and $D_F=9$, the value of $D_R/(2 \cdot |D_R - D_F|)$ becomes 0.25. Therefore, the switch 130 is controlled by the second comparison circuit 129 so as to select the output signal $D_R$.

Here, let us consider the case where there is not such edge switching. When a change from the arithmetic operation period (x+k−1) to the arithmetic operation period (x+k) is observed, the output signal $D_R$ changes from 12 to 1. The adder 122, the first delay circuit 123, and the first comparison circuit 124 all shown in FIG. 7 compose a block for detecting a point at which the output signal $D_R$ in the current arithmetic operation period increases by 1 with respect to the output signal $D_R$ in the previous arithmetic operation period. Therefore, at the change point from the arithmetic operation period (x+k−1) to the arithmetic operation period (x+k), the first comparison circuit 124 cannot detect the increase of 1.

Then, in this case, it is detected that the output signal $D_R$ does not increase by 1, but the output $D_F$ increases by 1, which results in that it becomes possible to detect the periodicity of the fractional portion of the number of accumulated clocks at the change point from the arithmetic operation period (x+k−1) to the arithmetic operation period (x+k).

4-2. Phase Comparison Processing

Figure 9A:
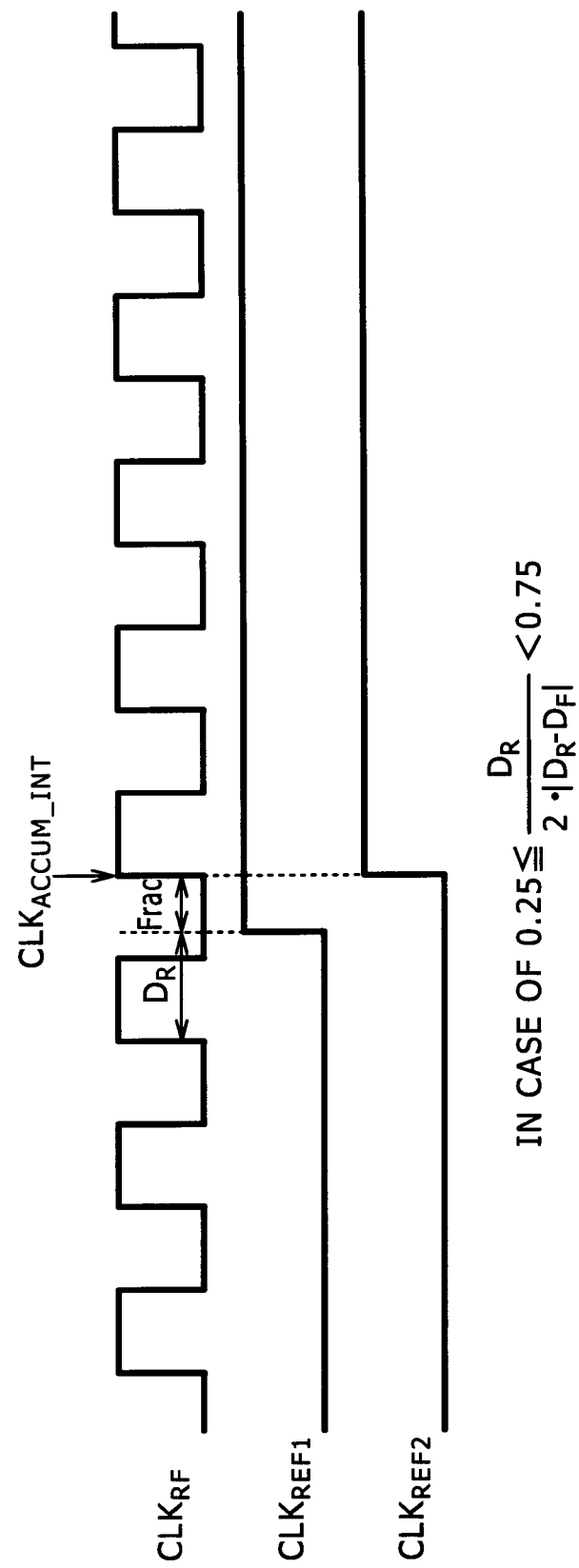
FIG. 9A is a timing chart showing phase correcting processing executed by the corrected value calculating portion included in the PLL circuit according to the third embodiment of the present disclosure.
Figure 9B:
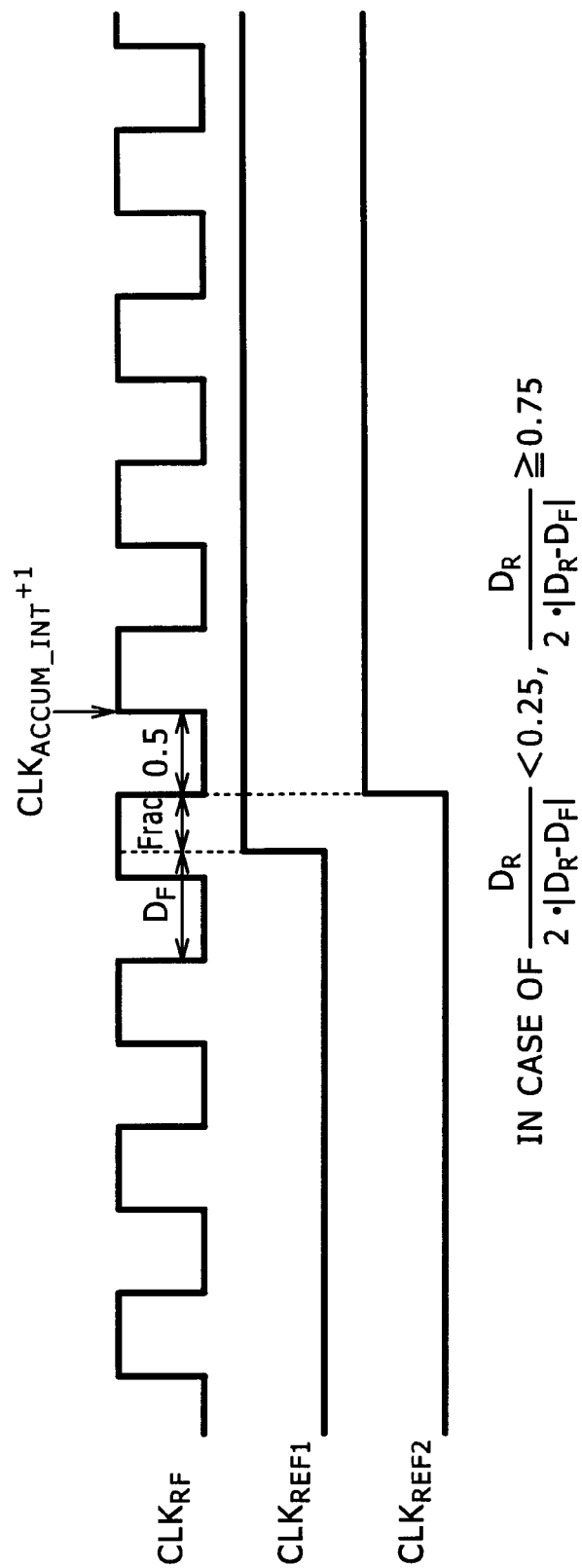
FIG. 9B is a timing chart showing the phase correcting processing executed by the corrected value calculating portion included in the PLL circuit according to the third embodiment of the present disclosure.

FIGS. 9A and 9B are timing charts showing phase comparison processing executed by the corrected value calculating portion 109' included in the PLL circuit according to the third embodiment of the present disclosure.

When the result obtained from the second comparison circuit 129 included in the corrected value calculating portion 109' shown in FIG. 7 is a result representing selection of the output signal $D_R$ as shown in FIG. 9A, for example, the re-timing circuit 110 in the PLL circuit 100' shown in FIG. 5 generates a second reference clock $CLK_{REF2}$ obtained through the re-timing for the output clock $CLK_{REF1}$ from the first reference clock oscillation circuit 103 at the rising edge of the output clock $CLK_{RF}$ from the oscillation circuit 105.

In addition, the first flip flop 111 holds therein the output signal from the second accumulative adder 104 at the rising edge of the second reference clock $CLK_{REF2}$. This is equivalent to that when the number of accumulated clocks of the output clock $CLK_{RF}$ from the oscillation circuit 105 is represented with the decimal point, the integer value $CLK_{ACCUM\_INT}$ obtained by rounding up the fractional portion thereof is calculated. Therefore, the number $CLK_{ACCUM}$ of accumulated clocks, represented with the decimal point, of the output clock $CLK_{RF}$ from the oscillation circuit 105 at the rising edge of the output clock $CLK_{REF1}$ of the first reference clock oscillation circuit 103 is obtained from Expression (11):

$$CLK_{ACCUM} = CLK_{ACCUM\_INT} - Frac \qquad (11)$$

$$Frac = 1 - \frac{D_R}{D_T}$$

where $D_T = 2 \cdot |D_R - D_F|$

Therefore, the third adder 113 in the PLL circuit 100' shown in FIG. 5 subtracts the number $CLK_{ACCUM}$ of accumulated clocks, represented with the decimal point, of the output clock $CLK_{RF}$ from the oscillation circuit 105 from the output signal from the first accumulative adder 102 for accumulatively adding "N" as the digitally represented set frequency driving ratio 101, thereby operating as a phase comparator.

On the other hand, when the result obtained from the second comparison circuit 129 included in the corrected value calculating portion 109' shown in FIG. 7 is a result representing selection of the output signal $D_F$ as shown in FIG. 9B, for example, the re-timing circuit 110 in the PLL circuit 100' shown in FIG. 5 generates a second reference clock $CLK_{REF2}$ obtained through the re-timing for the output clock $CLK_{REF1}$ from the first reference clock oscillation circuit 103 at the falling edge of the output clock $CLK_{RF}$ from the oscillation circuit 105.

In addition, the first flip flop 111 holds therein the output signal from the second accumulative adder 104 at the rising edge of the second reference clock $CLK_{REF2}$. Therefore, the number $CLK_{ACCUM}$ of accumulated clocks, represented with the decimal point, of the output clock $CLK_{RF}$ from the oscillation circuit 105 at the rising edge of the output clock $CLK_{REF1}$ from the first reference clock oscillation circuit 103 is obtained from Expression (12):

$$CLK_{ACCUM} = CLK_{ACCUM\_INT} + 0.5 - Frac \qquad (12)$$

$$Frac = 1 - \frac{D_F}{D_T}$$

where $D_T = 2 \cdot |D_R - D_F|$

Therefore, the third adder 113 in the PLL circuit 100' shown in FIG. 5 subtracts the number $CLK_{ACCUM}$ of accumulated clocks, represented with the decimal point, of the output clock $CLK_{RF}$ from the oscillation circuit 105 from the output signal from the first accumulative adder 102 for accumulatively adding the digitally represented set frequency driving ratio "N" 101, thereby operating as a phase comparator.

It is only necessary to execute the phase comparing processing for using both of Expression (11) and Expression (12) appropriately in accordance with the comparison result obtained from the second comparison circuit 129 included in the corrected value calculating portion 109' shown in FIG. 7.

5. FOURTH EMBODIMENT

5-1. Configuration of Wireless Terminal Apparatus Including PLL Circuit

Figure 10:
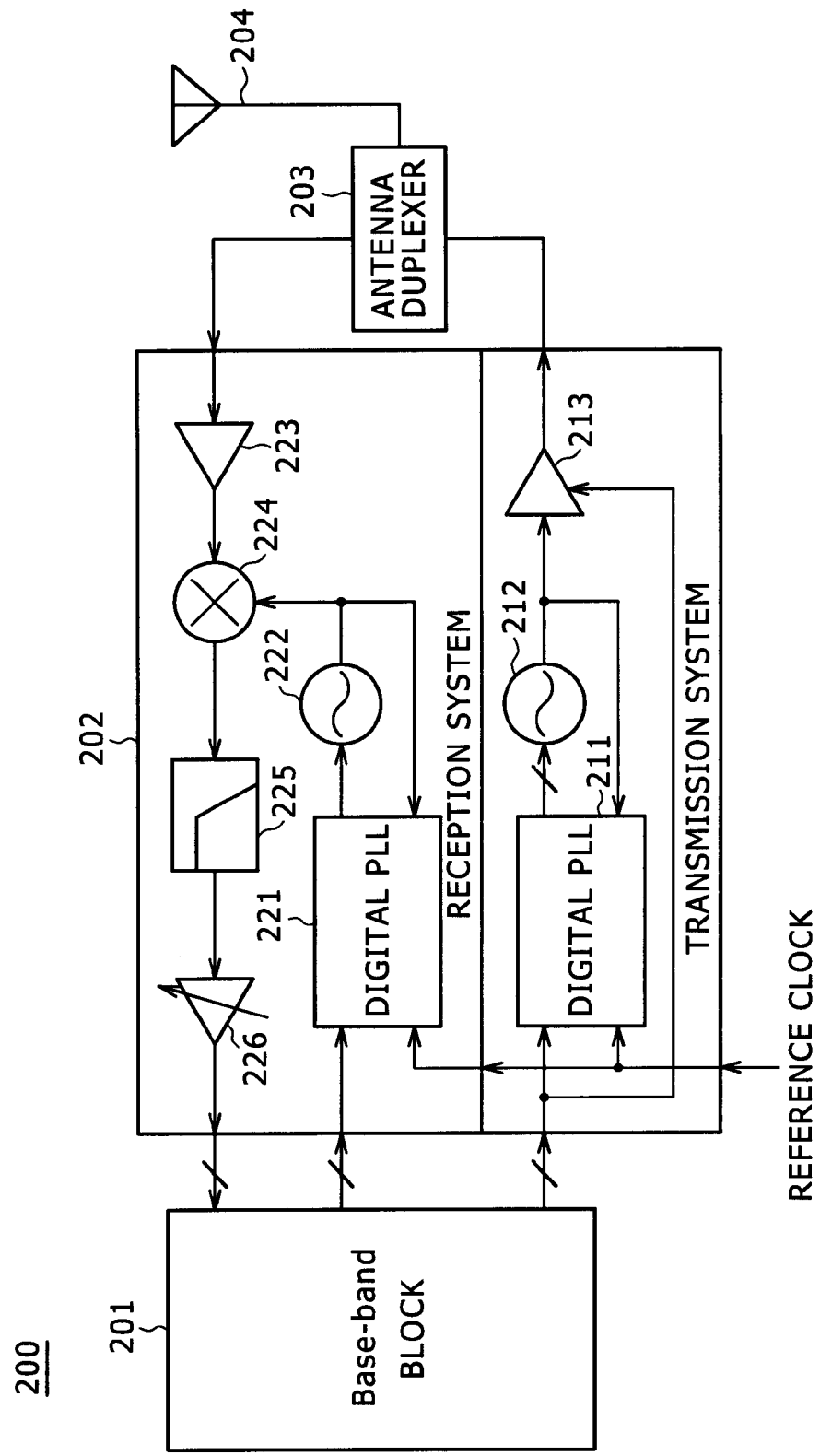
FIG. 10 is a block diagram, partly in circuit, showing a configuration of a wireless terminal apparatus, as a communication apparatus according to a fourth embodiment of the present disclosure, including the PLL circuit according to the first embodiment of the present disclosure.
Figure 11:
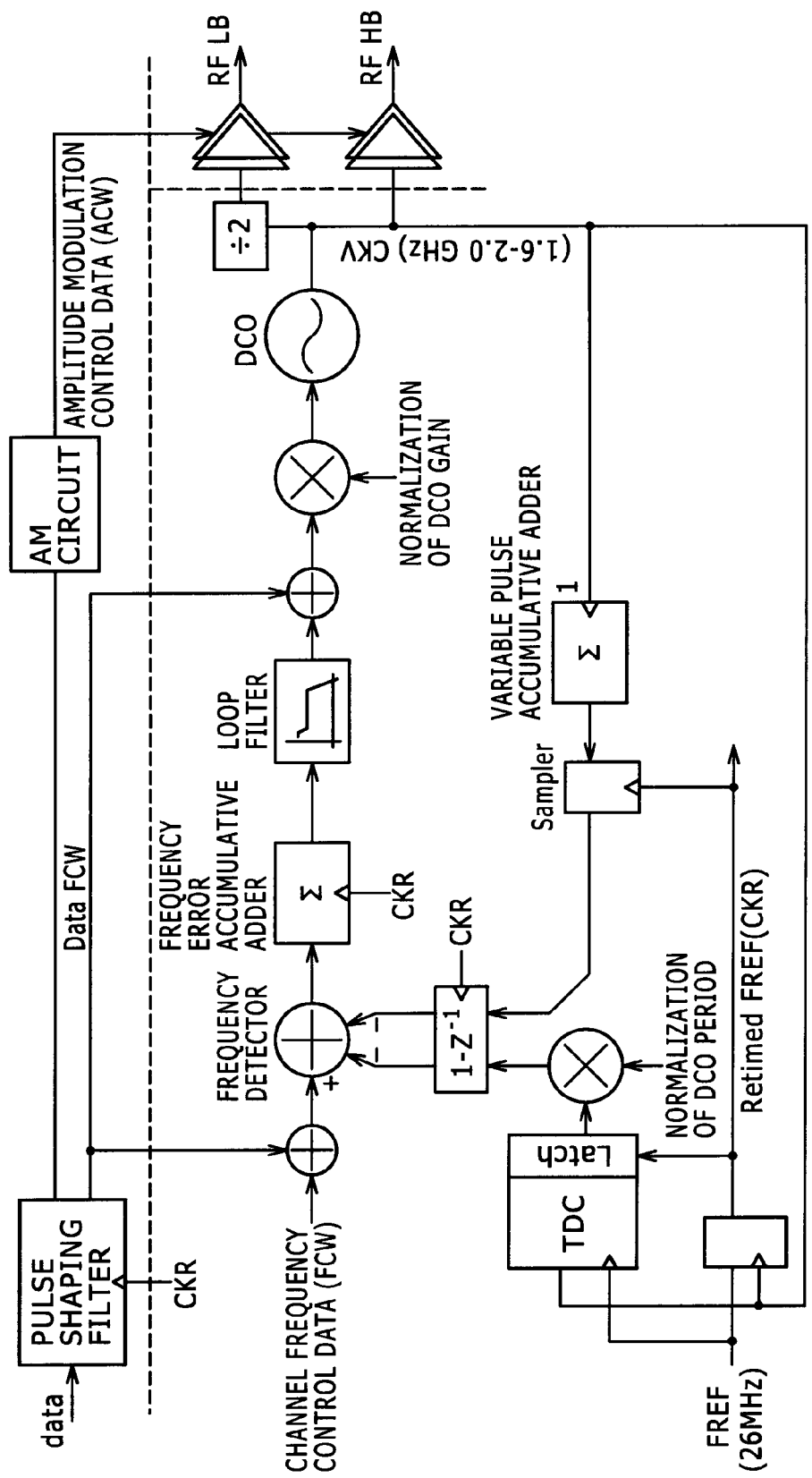
FIG. 11 is a block diagram, partly in circuit, showing a configuration of an example of an All-Digital PLL circuit using a DCO.

Next, a description will be given with respect to a wireless terminal apparatus as a communication apparatus according to a fourth embodiment of the present disclosure including the PLL circuit according to the first embodiment of the present disclosure. It is noted that although the wireless terminal apparatus according to the fourth embodiment of the present disclosure includes the PLL circuit 100 according to the first embodiment of the present disclosure, instead, the wireless terminal apparatus according to the fourth embodiment of the present disclosure may also include the PLL circuit 100' according to the second embodiment of the present disclosure or the PLL circuit according to the third embodiment of the present disclosure. FIG. 10 is a block diagram, partly in circuit, showing the configuration of a wireless terminal apparatus 200 according to the fourth embodiment of the present disclosure including the PLL circuit 100 according to the first embodiment of the present disclosure. Hereinafter, the configuration of the wireless terminal apparatus 200 according to the fourth embodiment of the present disclosure will be described in detail with reference to FIG. 10.

As shown in FIG. 10, the wireless terminal apparatus 200 includes a base-band circuit (Base-band Block) 201, a transmission/reception module 202, an antenna duplexer 203, and an antenna 204 through which an electric wave is transmitted/received.

The base-band circuit 201 is a circuit for handling a base-band signal, and exchanges a signal with the transmission/reception module 202. The transmission/reception module 202 exchanges a signal with the base-band circuit 201, thereby executing signal processing. The antenna duplexer 203 exchanges a signal with the transmission/reception module 202. The electric wave is transmitted/received through the antenna 204.

In addition, the transmission/reception module 202 is sorted into a transmission system and a reception system. In this case, the transmission system includes a digital PLL 211, an oscillator 212, and a low-noise amplifier 213. Also, the reception system includes a digital PLL 221, an oscillator 222, a low-noise amplifier 223, and a down-converter 224, a low-pass filter 225, and a variable gain converter 226.

Here, the PLL circuit 100 according to the first embodiment of the present disclosure shown in FIG. 2, for example, can be applied to each of the digital PLLs 211 and 221 shown in FIG. 10. Or, the PLL circuit 100' according to the second embodiment of the present disclosure shown in FIG. 5, for example, can also be applied to each of the digital PLLs 211 and 221 shown in FIG. 10 instead of the PLL circuit 100. The PLL circuit 100 is applied to the wireless terminal apparatus 200, which results in that the wireless terminal apparatus 200 can have the effects of the first to third embodiments of the present disclosure described above. In a word, the wireless terminal apparatus 200 according to the fourth embodiment of the present disclosure can reduce the discontinuity of the offset generated when the gain of the variable gain amplifying circuit is switched over to another one, thereby realizing the high-speed locking operation.

Note that, it goes without saying that the configuration of the wireless terminal apparatus 200 shown in FIG. 10 is merely an example, and the present disclosure is by no means limited thereto. The PLL circuit of the present disclosure can be applied to a communication apparatus as long as the communication apparatus uses the digital PLL. Any of the PLL circuits 100 and 100' according to the first and second embodiments of the present disclosure, for example, can be applied to such a PLL circuit.

6. CONCLUSION

As described above, according to the PLL circuits according to the first to third embodiments of the present disclosure, the corrected value is calculated and is added to the fractional portion of the number of accumulated clocks, which results in that it is possible to reduce the effect of the periodic error generated due to the finite resolution of the TDC circuit. In addition, according to the PLL circuit according to the second embodiment of the present disclosure, the addition of the corrected value is carried out under the condition that an influence of the periodic error of the TDC circuit becomes remarkable, which results in that the reduction of an amount of arithmetic operation becomes possible under the condition that the influence of the periodic error of the TDC circuit is less.

In addition, according to the PLL circuit according to the third embodiment of the present disclosure, it is possible to remove the influence of the discontinuous point in detection of the periodic error of the TDC circuit. In addition, it is possible to reduce the influence of the detection error of the TDC circuit generated under the condition that the rising edge of the reference clock, and the rising edge of the oscillation clock becomes close to each other.

Although a series of processing described in the embodiments described above may be executed by dedicated hardware, the series of processing may also be executed by software (application). When the series of processing is be executed by the software, a computer program is executed by a general-purpose or dedicated computer, thereby making it possible to realize the series of processing described above.

Although the embodiments of the present disclosure have been described so far with reference to the accompanying drawings, the present disclosure is by no means limited thereto. It is obvious that a person who has a normal knowledge in the technical field to which the present disclosure belongs hits upon various kinds of changes or modifications within the category of the technical idea disclosed in the appended claims. Also, it is understood that the various kinds of changes or modifications naturally belong to the technical scope of the present disclosure.

The present application contains subject matter related to that disclosed in Japanese Priority Patent Application JP 2010-262781 filed in the Japan Patent Office on Nov. 25, 2010, the entire content of which is hereby incorporated by reference.

What is claimed is:
1. A PLL circuit, PLL standing for phase locked loop, comprising:
a number-of-accumulated clocks detecting portion detecting the number of accumulated clocks of an oscillation circuit as a digital value;

a periodicity detecting portion detecting periodicity of a digital value of a fractional portion of the number of accumulated clocks of said oscillation circuit with a first reference clock as a reference;

a corrected value calculating portion calculating a corrected value from a digital value of one period of an output clock of said oscillation circuit, a digital value of one period of periodicity which the fractional portion of the number of accumulated clocks of said oscillator circuit has, and a value obtained by counting the number of first reference clocks from starting points of periods of the periodicity which the fractional portion of the number of accumulated clocks of said oscillator circuit has; and an adding portion adding the corrected value to the fractional portion of the number of accumulated clocks with the first reference clock from the starting points of the periods of the periodicity.

2. The PLL circuit according to claim 1, wherein said number-of-accumulated clocks detecting portion includes:

a TDC circuit detecting the fractional portion of the number of accumulated clocks of said oscillation circuit, TDC standing for time-to-digital converter.

3. The PLL circuit according to claim 2, further comprising:

a switching portion switching presence or absence of addition of the corrected value by said adding portion, wherein said switching portion controls the switching of presence or absence of the addition of the corrected value by said adding portion in accordance with a relationship among a frequency dividing ratio, a resolution of said TDC circuit, the digital value of one period of the periodicity which the fractional portion of the number of accumulated clocks has, and a constant used to control a loop band.

4. The PLL circuit according to claim 1, further comprising:

a convergence detecting portion detecting a convergence state of a PLL, wherein said convergence detecting portion controls switching of presence or absence of addition of the corrected value by said adding portion under a condition that an arbitrary set convergence state is reached.

5. The PLL circuit according to claim 1, further comprising:

a re-timing portion making re-timing for the first reference clock with the output clock from said oscillation circuit or a clock obtained by frequency-dividing the output clock, wherein said number-of-accumulated clocks detecting portion uses a clock obtained through re-timing for the first reference clock by said re-timing portion as a second reference clock, and holds therein an output of an integer portion of the number of accumulated clocks of said oscillation circuit at a timing of a rising edge of the second reference clock.

6. The PLL circuit according to claim 5, wherein when said re-timing portion uses a rising edge as an edge for the re-timing, said number-of-accumulated clocks detecting portion detects periodicity of a digital value of a time difference between a rising edge of the first reference clock, and a rising edge of one of an output clock of said oscillation circuit and a clock obtained by frequency-dividing the output clock.

7. The PLL circuit according to claim 5, wherein when said re-timing portion uses a falling edge as an edge for the re-timing, said number-of-accumulated clocks detecting portion detects periodicity of a digital value of a time difference between a rising edge of the first reference clock, and a falling edge of one of an output clock of said oscillation circuit and a clock obtained by frequency-dividing the output clock.

8. The PLL circuit according to claim 5, further comprising:

a phase comparator carrying out an arithmetic operation subtracting both of a digital value of an integer portion of the number of accumulated clocks of said oscillation circuit, and a digital value of a fractional portion of the number of accumulated clocks of said oscillation circuit which are held at a timing of the rising edge of the second reference clock from a value obtained by accumulatively adding a frequency dividing ratio represented by a digital value every first reference clock.

9. The PLL circuit according to claim 8, wherein when said re-timing portion uses a rising edge as an edge for the re-timing, said phase comparator uses a fractional portion calculated from a digital value of a time difference between a rising edge of the first reference clock of outputs from said number-of-accumulated clocks detecting portion, and a rising edge of one of an output clock from said oscillation circuit and a clock obtained by frequency-dividing the output clock from said oscillation circuit as a fractional portion of the number of accumulated clocks of said oscillation circuit.

10. The PLL circuit according to claim 8, wherein when said re-timing portion uses a falling edge as an edge for the re-timing, said phase comparator uses a fractional portion calculated from a digital value of a time difference between a rising edge of the first reference clock of outputs from said number-of-accumulated clocks detecting portion, and a falling edge of one of an output clock from said oscillation circuit and a clock obtained by frequency-dividing the output clock from said oscillation circuit as a fractional portion of the number of accumulated clocks of said oscillation circuit.

11. An error correcting method for a PLL circuit, PLL standing for phase locked loop, comprising:

detecting the number of accumulated clocks of an oscillation circuit as a digital value;

detecting periodicity of a digital value of a fractional portion of the number of accumulated clocks of said oscillation circuit with a first reference clock as a reference;

calculating a corrected value from a digital value of one period of an output clock of said oscillation circuit, a digital value of one period of periodicity which the fractional portion of the number of accumulated clocks of said oscillator circuit has, and a value obtained by counting the number of first reference clocks from starting points of periods of the periodicity which the fractional portion of the number of accumulated clocks of said oscillator circuit has; and adding the corrected value to the fractional portion of the number of accumulated clocks with the first reference clock from the starting points of the periods of the periodicity.

12. A communication apparatus, comprising:

a PLL circuit, PLL standing for phase locked loop, including a number-of-accumulated clocks detecting portion detecting the number of accumulated clocks of an oscillation circuit as a digital value, a periodicity detecting portion detecting periodicity of a digital value of a fractional portion of the number of accumulated clocks of said oscillation circuit with a first reference clock as a reference, a corrected value calculating portion calculating a corrected value from a digital value of one period of an output clock of said oscillation circuit, a digital value of one period of periodicity which the fractional portion of the number of accumulated clocks of said oscillator circuit has, and a value obtained by counting the number of first reference clocks from starting points of periods of the periodicity which the fractional portion of the number of accumulated clocks of said oscillator circuit has, and an adding portion adding the corrected value to the fractional portion of the number of accumulated clocks with the first reference clock from the starting points of the periods of the periodicity.

13. A correction circuitry, comprising:

a clock output portion outputting a plurality of clocks;

a first detecting portion detecting a number of accumulated clocks outputted from the clock output portion as a digital value;

a second detecting portion detecting periodicity of a digital value of a fractional portion of the number of accumulated clocks with a first reference clock as a reference;

a calculating portion calculating a correction value from
a digital value of one period of an output clock from said clock output portion,
a digital value of one period of periodicity which the fractional portion of the number of accumulated clocks has, and
a value obtained by counting a number of first reference clocks from starting points of periods of the periodicity which the fractional portion of the number of accumulated clocks from said clock output portion has; and a correcting portion correcting the fractional portion of the number of accumulated clocks with the first reference clock from the starting points of the periods of the periodicity according to the correction value.

14. The correction circuitry according to claim 13, wherein the clock output portion comprises an oscillation circuit.

15. The correction circuitry according to claim 13, wherein the clock output portion is an oscillation circuit.

16. The correction circuitry according to claim 13, wherein the correction circuitry is at least a portion of a PLL circuit.

17. The correction circuitry according to claim 13, wherein the correction circuitry is a PLL circuit.

* * * * *